US010115517B2

(12) United States Patent
Ette et al.

(10) Patent No.: US 10,115,517 B2
(45) Date of Patent: Oct. 30, 2018

(54) COIL ARRANGEMENT FOR GENERATING A ROTATING ELECTROMAGNETIC FIELD AND POSITIONING SYSTEM FOR DETERMINING A POSITION OF AN IDENTIFICATION TRANSMITTER

(71) Applicant: Volkswagen Aktiengesellschaft, Wolfsburg (DE)

(72) Inventors: Bernd Ette, Wolfsburg (DE); Bernhard Holldack, Wolfsburg (DE)

(73) Assignee: Volkswagen Aktiengesellschaft, Wolfsburg (DE)

( * ) Notice: Subject to any disclaimer, the term of this patent is extended or adjusted under 35 U.S.C. 154(b) by 729 days.

(21) Appl. No.: 14/635,381

(22) Filed: Mar. 2, 2015

(65) Prior Publication Data
US 2015/0179332 A1 Jun. 25, 2015

Related U.S. Application Data

(63) Continuation of application No. PCT/EP2013/067968, filed on Aug. 30, 2013.

(30) Foreign Application Priority Data

Sep. 1, 2012 (DE) .................. 10 2012 017 390

(51) Int. Cl.
*H01F 27/28* (2006.01)
*H01F 21/02* (2006.01)
(Continued)

(52) U.S. Cl.
CPC .......... *H01F 27/2847* (2013.01); *G01B 7/003* (2013.01); *G01R 33/0041* (2013.01);
(Continued)

(58) Field of Classification Search
CPC ........ H01F 17/0006; H01F 17/02; H01F 7/20; H01F 27/2847; H01F 27/24; H01F 27/40;
(Continued)

(56) References Cited

U.S. PATENT DOCUMENTS 2,406,704 A * 8/1946 Mossay ................. H01F 30/12
307/156
4,912,618 A * 3/1990 Krinickas, Jr. ....... H01F 27/303
363/37
(Continued)

FOREIGN PATENT DOCUMENTS

DE 103 25 246 B3 11/2004
DE 10 2007 042 370 A1 5/2008
(Continued)

OTHER PUBLICATIONS

Chinese Office Action and Search Report for Chinese Application No. 201380057633.X dated Jun. 21, 2016—English translation.

*Primary Examiner* — Mangtin Lian
(74) *Attorney, Agent, or Firm* — Muncy, Geissler, Olds & Lowe, P.C.

(57) ABSTRACT

A coil arrangement is provided for generating a rotating electromagnetic field, comprising at least three coils, each having at least one associated coil winding. The coil arrangement further comprises a ferromagnetic coil yoke which establishes a magnetic coupling between the at least three coils.

7 Claims, 16 Drawing Sheets

(51) Int. Cl.
*H01F 7/20* (2006.01)
*H01F 17/00* (2006.01)
*H01F 17/02* (2006.01)
*H01Q 7/08* (2006.01)
*H01Q 21/24* (2006.01)
*G01B 7/00* (2006.01)
*G01S 5/02* (2010.01)
*G01S 13/76* (2006.01)
*G01R 33/00* (2006.01)
*G07C 9/00* (2006.01)
*H01F 27/24* (2006.01)
*H01F 27/40* (2006.01)
*H01H 50/44* (2006.01)

(52) U.S. Cl.
CPC .......... *G01S 5/0226* (2013.01); *G01S 13/767* (2013.01); *G07C 9/00111* (2013.01); *H01F 7/20* (2013.01); *H01F 17/0006* (2013.01); *H01F 17/02* (2013.01); *H01F 27/24* (2013.01); *H01F 27/40* (2013.01); *H01H 50/44* (2013.01); *H01Q 7/08* (2013.01); *H01Q 21/24* (2013.01)

(58) Field of Classification Search
CPC . H01F 3/00; H01F 2003/005; G07C 9/00111; H01Q 7/08; H01Q 21/24; H01H 50/44; G01B 7/003; G01S 5/0226; G01S 13/767; G01R 33/0041

USPC ................. 336/170, 69, 184, 214, 215, 147; 361/160, 270; 340/5.61
See application file for complete search history.

(56) References Cited

U.S. PATENT DOCUMENTS

| | | | |
|---|---|---|---|
| 5,347,289 | A | 9/1994 | Elhardt |
| 5,425,367 | A | 6/1995 | Shapiro et al. |
| 5,646,524 | A | 7/1997 | Gilboa |
| 6,188,355 | B1 | 2/2001 | Gilboa |
| 6,792,667 | B2 * | 9/2004 | Roy .................. H01F 27/263 174/260 |
| 2003/0168921 | A1 | 9/2003 | Molina-Martinez |
| 2004/0061660 | A1 * | 4/2004 | Yoshida ............ G07C 9/00309 343/788 |
| 2008/0112111 | A1 * | 5/2008 | Lensky .................. G10K 15/02 361/437 |

FOREIGN PATENT DOCUMENTS

| | | |
|---|---|---|
| EP | 0 576 187 A1 | 12/1993 |
| JP | 2003-524751 A | 8/2003 |
| JP | 2008-060634 A | 3/2008 |
| KR | 10-2007-0101702 A | 10/2007 |
| WO | WO 99/42856 A2 | 8/1999 |
| WO | WO 2004/107276 A1 | 12/2004 |

* cited by examiner

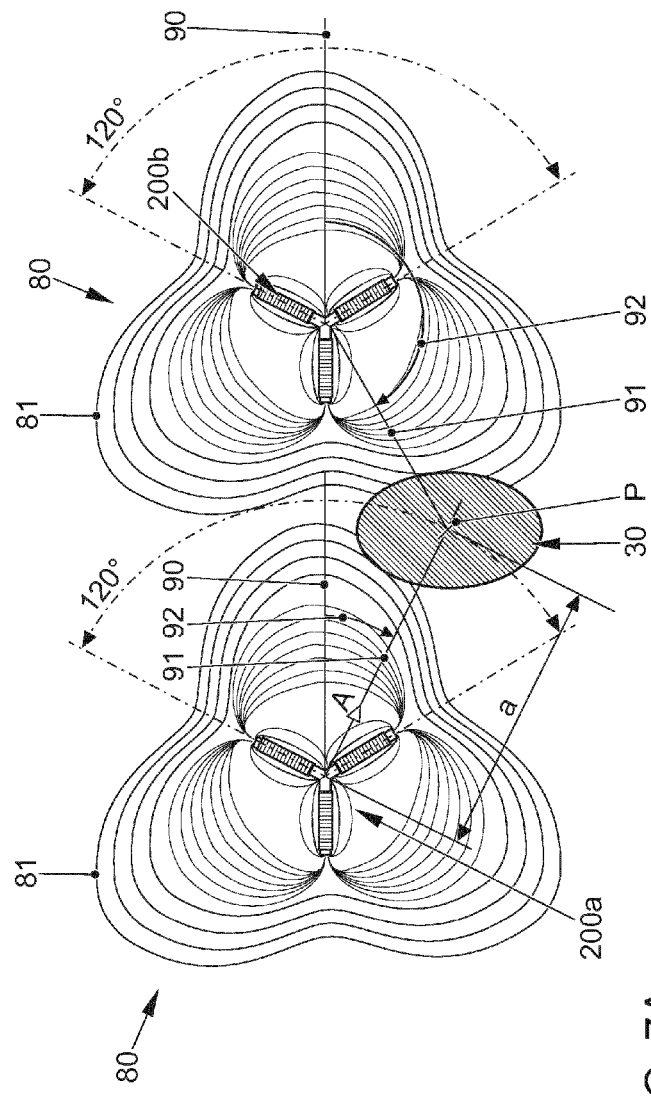
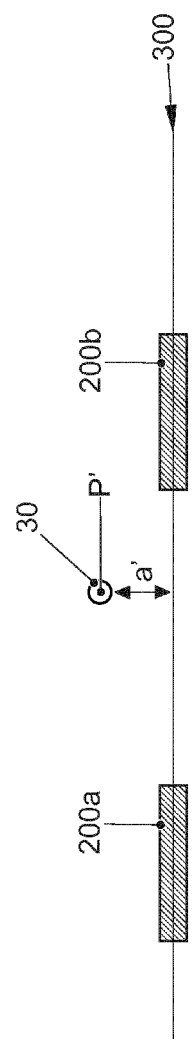
FIG. 7A
FIG. 7B

COIL ARRANGEMENT FOR GENERATING A ROTATING ELECTROMAGNETIC FIELD AND POSITIONING SYSTEM FOR DETERMINING A POSITION OF AN IDENTIFICATION TRANSMITTER

This nonprovisional application is a continuation of International Application No. PCT/EP2013/067968, which was filed on Aug. 30, 2013, and which claims priority to German Patent Application No. 10 2012 017 390.3, which was filed in Germany on Sep. 1, 2012, and which are both herein incorporated by reference.

BACKGROUND OF THE INVENTION

Field of the Invention

Various embodiments relate to a coil arrangement for generating a rotating electromagnetic field, and to locating systems for determining a position of an identification transmitter. Such locating systems may include inventive coil arrangements.

Description of the Background Art

Techniques are known that permit locating, i.e. determining a position, e.g. of identification transmitters. One example of an identification transmitter would be for instance a key for a motor vehicle. Thus techniques are known that permit the position of the key in the vicinity of the motor vehicle to be determined in order to attain access control to the motor vehicle. Conventional techniques are typically based on a measurement of a field strength of an electromagnetic field transmitted by a central transmitter. Since the field strength decreases as distances to the transmitter increase (damping or decay of the field strength), it is possible to use a receiver antenna in the key to deduce a position relative to the transmitter from a measurement of the field strength.

However, such techniques may have limited precision in determining the position of the identification transmitter, e.g. due to limited precision when measuring the field strength. Typical precision in determining positions with known systems is e.g. 20 cm-approx. 2 m. Moreover, systemic corruptions may occur; in particular the decrease in the field strength of the electromagnetic field may be disturbed, for example, due to magnetic objects such as for instance the vehicle body, etc., so that determining the position of the identification transmitter may be suffer from a certain systemic error. Such cases may make it necessary to perform a one-time manual measurement of the decay of the field strength in and around the motor vehicle for calibrating position determination. Such a manual measurement may be time-consuming and there may be associated costs. The calibration itself may also be the source of errors. Moreover, it may not be possible also to perform the position determination inside the motor vehicle, or it may only be possible with limitations. This may be the case because the decay of the field strength may be profoundly disturbed in the interior of the motor vehicle by a wide variety of components.

The foregoing described disadvantageous effects of the prior art with respect to the techniques for position determination itself. However, disadvantageous effects may also occur with respect to the system architecture of related devices, as shall be illustrated in the following. For instance, previously known locating systems for position determination typically have a central control device that is connected by means of power supply lines to the individual transmitters that transmit the electromagnetic field. The provision of these supply lines to the plurality of transmitters, typically three to five transmitters, may claim installation space in the motor vehicle, however, and render necessary time-consuming and expensive wiring to e.g. two core or four core cable lines. Moreover, such systems frequently have only limited modularity because it is not possible to operate the system functionally with a lower or greater number of transmitters with nothing further—it is therefore not possible to provide different equipment variants, or it is only possible to a limited degree. In addition, the system may be comparatively susceptible to faults because a failure of or disturbance to the central control device frequently may result in complete failure of the system.

For the reasons provided in the foregoing there is a need for improved techniques for determining a position of a receiver. In particular there is a need for locating systems that make possible particularly precise position determination inside and outside of the motor vehicle and simultaneously have low susceptibility to faults and a simple and cost-effective system architecture.

SUMMARY OF THE INVENTION

It is therefore an object of the invention to provide in an embodiment a coil arrangement for generating a rotating electromagnetic field, wherein the coil arrangement includes at least three coils, each having at least one associated coil winding. The coil arrangement further includes an ferromagnetic coil yoke that establishes a magnetic coupling between the at least three coils.

The at least one coil winding may itself include a plurality of windings of an electrically conductive wire or of a conductor. The coils may include one or a plurality of coil windings; in other words, in a plurality of coil windings of one coil, the coil windings may be separately electrically contactable or tappable.

The magnetic coupling may be characterized by a specific magnetic flux that has e.g. a specific magnitude. A magnetic flux may be produced e.g. using continuous connections of the coil yokes. In particular the coil arrangement may be set up such that the magnetic flux assumes a specific value, e.g. approximately or exactly 0, in a center of the coil arrangement. E.g. the coil yoke may be continuous, that is without any or with only a few and/or with very few small or short interruptions or air gaps. It may be made of a ferromagnetic material, for instance iron, chromium, nickel, oxides of these metals such as ferrite, alloys made of iron, chromium, nickel, etc. The magnetic coupling may indicate a ferromagnetic exchange interaction that is embodied across the area range of the coil yoke.

It is possible for the at least three coils to be arranged in one coil plane and for adjacent coils to be arranged within the coil plane at angles of approximately 120°. E.g., adjacent coils may be arranged at angles of 120°±10°, preferably ±5°, particularly preferably ±0.5°. It may then be possible, with a comparatively simple actuation of the coils (e.g. with alternating voltages that are phase shifted by 120°) to generate the rotating electromagnetic (em) field. In general, however, other angles that adjacent coils form with one another within the coil plane are also possible. If the coils are arranged within the coil plane, this may mean that the coils (or their central axes) do not form any angle, or form only a small angle, e.g. ±10°, preferably ±5°, particularly preferably ±1°, with vectors that span the coil plane.

When there are different angles of adjacent coils within the coil plane, it may be possible to adjust a phase shift of the alternating voltages for actuating the different coils correspondingly at the different angles so that a rotating electromagnetic field that has a constant angular velocity is generated.

Naturally it is also possible to use e.g. four or six or more coils that are arranged in the coil plane at pre-specified angles to adjacent coils. Purely as an illustration, and without being limiting, four (six) coils may be arranged at angles of 90° (60°). Other corresponding symmetrical configurations are possible in which adjacent coils are always at the same angle to one another.

Embodiments were described in the foregoing in which all of the coils lie within one coil plane. Such a coil plane may determine a plane of rotation of the rotating em (electromagnetic) field. However, it is also possible to have embodiments in which individual or a plurality of coils lie outside of the coil plane that is defined by at least two coils. In other words, individual or a plurality of coils are tilted with respect to the coil plane. In such a case it may also be possible for the coil plane to define the plane of rotation.

It is possible for instance for a third coil of the at least three coils to form an angle with a coil plane spanned by a first coil and second coil of the at least three coils. E.g. the angle that the third coil forms with the coil plane may be in a range of 1°-45°, preferably in a range of 20°-30°. In one such case in which individual coils are tilted with respect to the coil plane it is possible to attain smaller dimensioning of the coil arrangement within the coil plane. This may offer advantages in applications in which the coil arrangement is to be positioned in areas e.g. of a motor vehicle in which limited space is available, for instance a B or C column of a motor vehicle. However, it should be understood that even if one or a plurality of coils are tilted with respect to the coil plane, one component of the electromagnetic field generated by these coils may lie in the coil plane and it is therefore possible to transmit the rotating electromagnetic field comparable to the case in which all of the coils lie within the coil plane. In particular the rotating electromagnetic field may be transmitted such that it has a constant angular velocity within the plane of rotation. It would also be possible for the rotating em field to have a field strength that is a function of the angle.

It is possible for the ferromagnetic coil yoke to be arranged continuous within the at least three coils and for the coil arrangement furthermore to include at least three capacitors, each of which is connected in series to one of the at least three coils and to include a housing having external electrical contacts and mechanical retention elements. In other words, each coil in the series (connection in series) may be connected to a capacitor. The value of the inductivity of the coil and the capacity of the capacitor may then determine a frequency of the em field generated in a manner known to one skilled in the art. The frequency may be e.g. in a range of 100 kHz to 10 MHz, preferably to 1 MHz, particularly preferably 125 kHz or 1 MHz.

The housing may have retention elements for fixing the at least three coils and the coil yoke. The housing may accommodate all parts of the coil arrangement and protect against external influences, dust and deposits, moisture, and shocks. The housing may be produced form a material that causes only comparatively little damping of the electromagnetic field. The house may preferably be produced from a plastic material. The electrical contacts may establish an electrical connection to a printed circuit board and in this way make possible actuation of and power supply for the coil arrangement.

It is possible for the ferromagnetic coil yoke to have arms extending radially from a center and for each of the coil windings of the at least three coils to have a number of windings about one of the arms.

The arms may be e.g. cylindrical and have e.g. a circular cross-section. Other cross-sectional shapes are possible (rectangular, square, ellipsoidal, etc.). In the above embodiment having three coils at 120°, the arms could be oriented as follows: 0°, 120°, 240° (azimuth angle to a center). One length of the arms could be e.g. a few cm, preferably in a range of 1-20 cm, particularly preferably in a range of 2-6 cm. The arms may run together in a center. The shape of the coil arrangement described by such a configuration could be called "star-shaped."

In one such configuration the coil arrangement may have an extension perpendicular to the coil plane, since the coil windings extend about the coil yoke at a specific diameter. However, it is also possible to produce the coil arrangement in an integrated manner, e.g. using conductors on a printed circuit board. One such integrated embodiment may also be called lateral or planar structuring.

It is possible for each of the coil windings to be configured as a planar conductor, forming windings, on a printed circuit board and for the printed circuit board to have recesses for the ferromagnetic coil yoke and for the ferromagnetic coil yoke to be arranged above and below the printed circuit board. In one such embodiment it may be possible for the printed circuit board to be parallel or essentially parallel to the coil plane. The conductors may have a small extension compared to the above embodiment perpendicular to the coil plane, approximately less than 10 µm or less than 1 mm. This may have advantages when the installation space is limited. The ferromagnetic coil yoke may be fixed using the recesses.

It is possible for two or more coil windings, each having a number of windings that may be actuated jointly or separately to be present per coil and for the coil arrangement further to include at least three additional capacitors that are each connected in parallel to one of the two or more coil windings per coil. In this way it may be possible to provide a plurality of separately electrically contactable coil windings in a coil and therefore to provide different inductivities. There may therefore be a plurality of oscillating circuits having different resonance frequencies available. The coil arrangement may therefore transmit em fields at different frequencies. Moreover, it is possible to attain operation of the coil arrangement with comparatively low power consumption, especially compared to series connection with capacitors, by connecting each of the additional capacitors to a coil winding in parallel. This may have advantages, especially in applications in which only a limited reservoir of energy is available.

In general it may be possible for the at least one coil windings of the at least three coils to have the same geometries and/or windings. In other words, the at least three coils may be of the same manner and type. It may therefore also be possible to generate the rotating em field, which advantageously has a constant angular velocity of the rotation, by means of particularly simple current feed.

The foregoing referred primarily to a coil arrangement having at least three coils. It is possible to operate a plurality of such coil arrangements combined as a locating system for a receiver.

In accordance with another aspect, the invention relates to a locating system for determining the position of an identification transmitter for a motor vehicle, wherein the locating system includes at least two coils that are mounted location-fast at different locations of the motor vehicle and are each set up to be operated as transmitters for an electromagnetic field, wherein each of the at least two coils is coupled to a power supply line. The locating system further includes an identification transmitter having a receiver coil, wherein the identification transmitter is set up to be operated as a receiver for the at least two electromagnetic fields, and a control device that is set up in order to actuate the at least two coils via a computer unit via a bus system with a pre-specified sequence for generating the electromagnetic field.

Such a locating system may have the effect of a particularly simple system architecture; e.g., it may be possible to connect the computer units of the at least two coils to power supply lines that are present in any case in the motor vehicle or to the bus system that is present in any case. The coils may be actuated via the computer units, which may be arranged in the vicinity of the coils and may be coupled to the bus system and the power supply line, as well as the specific coil. The coil arrangement may include an alternating voltage source that is connected to the power supply line, for instance a 12 V direct current line voltage. In particular there may no longer be a need to provide power supply lines to the coils from a central control device. The electromagnetic fields of the locating system in accordance with the aspect currently under discussion may be conventional non-rotating fields.

In general one skilled in the art is familiar with the general operation of a locating system. It should be understood that, compared to the previously known locating systems, in accordance with the invention the result of particularly simple actuation and control may be attained by providing bus system and power supply line separately, for instance to a motor vehicle direct current line voltage.

In accordance with another aspect, the invention relates to a locating system for determining a position of an identification transmitter for a motor vehicle, wherein in accordance with another aspect of the invention the locating system includes at least two coil arrangements, wherein the at least two coil arrangements are mounted and set up location-fast at different locations of the motor vehicle, each to be operated as a transmitter for a rotating electromagnetic field. The locating system further includes the identification transmitter having a receiver coil, wherein the identification transmitter is set up to be operated as a receiver for the at least two rotating electromagnetic fields.

For instance, the locating system may be set up for determining the position of the identification transmitter in an exterior space, i.e. an environment or surroundings, of the motor vehicle. Alternatively or in addition, the locating system may be set up to determine the position in an interior space of the motor vehicle.

Thus, for instance, a frequency of the receiver coil may be tuned to the frequencies of the at least two coil arrangements. Preferably e.g. three or four coil arrangements may be provided. The coil arrangements may be mounted spaced apart from one another.

A particularly precise determination of the position of the identification transmitter may be attained by using at least two coil arrangements or at least two rotating electromagnetic fields. For instance, it may be possible to attain a precise determination of the position of the identification transmitter within a plane of rotation of the electromagnetic fields via the determination of a reference phase with respect to the at least two rotating electromagnetic fields and triangulation based on the determined at least two differential phases.

The locating system may furthermore include a control device that is set up to actuate the at least two coil arrangements for transmitting the specific rotating electromagnetic field in a pre-specified sequence.

The control device may be e.g. a central processing unit of the motor vehicle. The control device may be implemented e.g. as hardware or software or a combination thereof on the central processing unit of the motor vehicle.

It is possible for the control device to be coupled to the at least two coil arrangements via a bus system and for each of the at least two coil arrangements to be coupled to a power supply line and for each of the at least two coil arrangements to be set up in order to receive a control signal of the control device via the bus system and to generate the rotating electromagnetic field as a function of the control signal, wherein the energy for transmitting the rotating electromagnetic field is obtained via the power supply line.

For instance the coil arrangements may include a computer unit as an interface for communicating with the control device via the bus system. The computer unit may be set up to receive and process the control signal.

The supply line may be e.g. a vehicle electrical system for a motor vehicle. The power supply line may have e.g. other current-voltage relationships than is required for actuating the coils of the coil arrangements for generating the rotating em field. The power supply line may make available e.g. 12 V direct current voltage. Therefore the coil arrangements may have a circuit for current-voltage conversion, that is, an alternating voltage source. In this way it may be possible e.g. to supply the coil arrangements with energy, in a decentralized manner, for generating the rotating em field. As a result, it is possible to attain a simplified system architecture; it may in particular be essential to provide dedicated power supply lines from the control device to the individual coil arrangements. As a reaction to an instruction from the control device, via the bus system, the coil arrangements may selectively take energy from the vehicle electrical system in order to generate the rotating em field. Power supply lines of the vehicle electrical system are typically present in different areas of the motor vehicle, anyway, so that no manor structural modifications may be necessary.

It is possible for the control device to be set up for actuating the at least two coil arrangements such that they transmit the specific rotating electromagnetic field sequentially.

Sequential actuation may also be called time multiplexing; in other words, the electromagnetic fields may be transmitted at different times, for instance sequentially. This may occur e.g. using appropriately configured control signals: the interface for the coil arrangements may decode the control signals and transmit the specific em field time-delayed depending on the control signals. Then it may be possible to transmit via the bus system merely a single control system that commands the plurality of coil arrangements to transmit the em field at different times. This is explained in the following: Different embodiments are possible with respect to the control of the coil arrangements using the control device; the invention is not specially limited in this regard. For instance, it is possible for the control device to transmit a single control command via the bus system, which control command upon receipt in the coil arrangements initiates a timer, and after it runs out the specific coil arrangement transmits the rotating electromagnetic field for a period of time that is possibly also included in the control device. The specific parameters of the timer may be different from coil arrangement to coil arrangement and may be pre-specified by the control device. In this way it may in particular be possible to vary the sequence with which the at least two coil arrangements transmit the rotating electromagnetic field, for instance for different motor vehicles or even for an individual motor vehicle as a function of the time. It is also possible, for instance, for the sequence with which the at least two coil arrangements transmit the rotating electromagnetic field to be random. In such embodiments it is possible to raise security against malicious interventions in the locating systems by third parties.

The locating system may furthermore include at least one alternating voltage source that is connected to the at least two coil arrangements and to one power supply line and is set up to supply the at least two coils in each coil arrangement with an alternating voltage in order to generate the rotating electromagnetic field. The alternating voltages of the at least two coils may be in a pre-specified phase relationship with one another, wherein the phase relationship of adjacent coils may be pre-specified as a function of an angle that these adjacent coils form with one another within a coil plane.

The at least one alternating voltage source may be e.g. a suitable current source that effects a specific current through the coils of the coil arrangements. It is possible e.g. for there to be a connection to a direct voltage electrical system of the motor vehicle.

For instance, when there is a specific angle between adjacent coils of a coil arrangement, the phase relationship of the alternating voltage may be selected to be equal to this specific angle. In one specific embodiment in which three coils form angles of 120° to one another, therefore, the phase relationship of the alternating voltages with which the three coils are supplied may also be 120°.

It is possible e.g. for a first coil arrangement of the at least two coil arrangements to be installed in the area of a left-hand B column of the motor vehicle, for a second coil arrangement of the at least two coil arrangements to be installed in the area of a right-hand B column of the motor vehicle, and for a third coil arrangement of the at least two coil arrangements to be installed in the area of a back of the motor vehicle.

In such a configuration, it is possible e.g. to have a particularly precise determination of the position of the identification transmitter. This may be the case because a differential phase relative to a reference at different positions in the surroundings and in the interior space of the motor vehicle may assume particularly different values for the rotating em fields generated by three such transmitters. For instance, a lower error may therefore be obtained with triangulation based on the differential phases. In other words, triangulation of the differential phases is particularly precise for large distances/angles between the coil arrangements.

It is in particular possible for the at least two coil arrangements to be arranged such that planes of rotation of the at least two rotating electromagnetic fields are essentially parallel to one another. Alternatively or in addition, it is possible for the at least two coil arrangements to be installed in an area of 70 cm to 130 cm above the ground.

For instance, the plane of rotation may be spanned by at least two coils of a coil arrangement (coil plane). Using appropriate geometric arrangement of the different coils of the at least two coil arrangements it is therefore possible to attain a situation in which the planes of rotation are essentially parallel to one another. Essentially parallel may mean e.g.: ±20°, preferably ±5°, particularly preferably ±1°.

However, in general it is also possible for the planes of rotation of the various coil arrangements to form a smaller or a larger angle with one another. If this angle is for instance pre-specified and structurally known, it may be taken into account and calculated during the determination of the position of the identification transmitter. Triangulation can take this into account.

Typically it may be possible to obtain particularly good precision of the determination of the position of the identification transmitter for positions within the plane of rotation of the rotating electromagnetic field. Therefore it may be worthwhile for the three coil arrangements and thus the plane of rotation to be installed in an appropriate area above the ground. In this regard, it may in particular be possible for the plane of rotation to be parallel or essentially parallel to the ground. In this manner it is possible to determine the position simply and precisely because typically the identification transmitter of the motor vehicle is arranged in such an area above the ground when it is disposed for example in a jacket pocket or briefcase of a user.

In accordance with another aspect, the invention relates to a motor vehicle having a locating system for determining a position of an identification transmitter for a motor vehicle, wherein in accordance with another aspect of the invention the locating system of the motor vehicle includes at least two coil arrangements, wherein the at least two coil arrangements are mounted location-fast at different locations of the motor vehicle and are each set up to be operated as a transmitter for a rotating electromagnetic field. The locating system of the motor vehicle further includes the identification transmitter having a receiver coil, wherein the identification transmitter is set up to be operated as a receiver for the at least two rotating electromagnetic fields.

In accordance with another aspect, the invention relates to a method for determining a position of a receiver. The method includes the transmission of at least one electromagnetic field by a transmitter, wherein one amplitude of the at least one electromagnetic field rotates as a function of time relative to the specific transmitter. The method further relates to the receiver measuring the at least one electromagnetic field and to the determination of a differential phase for each of the at least one electromagnetic fields at the position of the receiver based on the measured at least one electromagnetic field. The method furthermore includes determining the position of the receiver based on the at least one determined differential phase.

The electromagnetic field may be a time-dependent electromagnetic alternating field having a specific frequency. The frequency may be e.g. in a range of 100 kHz to 10 MHz, preferably to 1 MHz, and particularly preferably 125 kH or 1 MHz. The transmitter may include e.g. an electromagnetic oscillation circuit having an inductivity and a capacitor; one skilled in the art is familiar with these techniques that make possible appropriate embodiment of the transmitter for generating these frequencies.

The electromagnetic (em) field may be called e.g. a rotating em field, since the amplitude may rotate about the transmitter in a plane of rotation as a function of time, that is, it may perform a rotational movement with an angular velocity. In other words, points of the same phase position, that is e.g. a maximum or minimum of the field strength of the em field, may be arranged, as a function of time, at different directions or angles relative to the transmitter. Figuratively, e.g. a field strength maximum may move like the light beam of a lighthouse (in this case the transmitter). In particular a rotational frequency of the rotational movement may be equal to the frequency of the em field itself. However, it is also possible for the rotational frequency to have other values. The rotational movement of the em field may be characterized (as is typical for all cyclical sequences) by a specific phase (phase position) of the movement; one full rotation may correspond to an accumulated phase of 360° or 2π. The rotating em field may move e.g. at a constant angular velocity. In general certain pre-specified dependencies of the angular velocity on the phase (angle) are possible. For instance, it may be possible for the plane of rotation to be oriented parallel or essentially parallel, i.e. e.g. less than ±20°, preferably less than ±10°, particularly preferably less than ±2°, with the horizontal, that is, e.g., essentially parallel to the ground. The rotating em field may be generated with a coil arrangement in accordance with another aspect of the invention.

A corresponding time-dependency of the field strength or phase situation of the em field at the location of the receiver may result using the rotational movement of the transmitted em field. The receiver may in particular be set up for measuring the field strength of the em field as a function of time and/or frequency-resolved. In addition, the receiver may be set up e.g. for measuring an amplitude of the magnetic field component of the em field that may be proportional to a field strength of the em field. It may then be possible to determine the differential phase from the measurement of the field strength, for instance with respect to a reference phase that may be determined in particular from the phase of the em field at the transmitter during transmission.

The following situation is described as a special illustrative example and not as an example that should be construed as limiting: at a phase position of 0°, the transmitter transmits the em field such that it points to the east (defined in any manner desired). But the receiver is now to the south of the transmitter and therefore does not (yet) "see" the maximum. Only at a phase of 90° at the transmitter does the maximum of the amplitude reach the receiver (if the rotating em field rotates clockwise). The differential phase may therefore be provided as −90° in this example. A corresponding example may naturally also be provided for values of the em field that differ from the maximum of the amplitude. E.g., this may be a certain trigger-level amplitude that is defined with respect to the rising or falling flank.

Naturally in general it is just as possible to determine the differential phase relative to another reference phase, for instance relative to a system clock or an external trigger signal, such as a user actuating a door handle or a recognized object being in the surrounding area or the like. It is also possible, e.g. to observe a minimum or a null crossing, or any desired phase position or significant points of the temporal course of characterizing observables, instead of the maximum of the amplitude. In general an amplitude of the magnetic component of the electromagnetic field may be observed or an amplitude of the electrical component; both may be significant for the field strength of the em field. However, the transmitter and/or the receiver may have at least one coil that is set up to interact inductively with the magnetic component of the electromagnetic field.

The position of the receiver may be determined from the differential phase. The term "position" may indicate very different precisions in the position determination. In one particularly simple embodiment, the term "position" may merely indicate an angle of the receiver relative to the transmitter (−90° in the example above). However, it is also possible for the term "position" also to indicate, additionally or alternatively to the angle relative to the transmitter, a distance from the transmitter, for instance within the plane of rotation of the em field. In addition, it is possible for the term "position" also to indicate, additionally or alternatively, a distance for example relative to this plane of rotation of the em field, i.e. perpendicular to the plane of rotation; in such a case it may in particular be possible for the term "position" to indicate an absolute position determination of the receiver within a reference coordinate system. The reference coordinate system may in general be selected as desired, but it may also be worthwhile to define it with reference to the at least one transmitter (the latter may be arranged e.g. at the origin of the reference coordinate system). In other words, the term "determination of a position" may indicate the determination of individual coordinates of the three-dimensional space, for instance distance and/or azimuth angle and/or polar angle of a spherical coordinate system, or even all coordinates of the three-dimensional space.

For instance, in various embodiments it may be worthwhile to perform a particularly precise determination of the position of the receiver. A particularly precise determination of the position of the receiver may include in particular determination of a plurality or of all coordinates of the three-dimensional space. In particular in such a case it may be possible to transmit more than one, for example two or three, electromagnetic fields using a plurality of transmitters, for example two or three transmitters. In other words, there may be one transmitter per field. Then a plurality of differential phases may be determined, e.g. relative to the em fields transmitted by the plurality of transmitters, and the position of the receiver may be determined particularly precisely taking into account the plurality of differential phases.

In different embodiments it may be possible for a plurality of em fields to be transmitted simultaneously at different frequencies, so-called frequency multiplexing. It may then be possible for the receiver to be embodied to measure the plurality of em fields at the different frequencies. Frequency multiplexing may have the result of determining the position particularly rapidly. In accordance with another aspect of the invention e.g. a locating system may be used for transmitting the two or more rotating em fields.

It is possible for the transmission for two or more electromagnetic fields to occur sequentially and for the measurement of the two or more electromagnetic fields to occur sequentially. The determination of the position of the receiver may occur based on triangulation for the at least two differential phases and the determination of the position of the receiver may include determining a direction and distance at which the receiver is arranged in a plane of rotation of the time-dependent electromagnetic field relative to at least one of the transmitters. Such a case may also be called time-multiplexing, since the plurality of em fields are transmitted sequentially, that is, one after the other or at different times. Then a plurality of differential phases from the plurality of measured em fields may be known and triangulation may enable a particularly precise determination of the position, in particular also of the distance to one or a plurality of transmitters. In general the triangulation can mean the determination of the position based on the measured differential phases and a known arrangement of the plurality of transmitters relative to one another. Techniques for triangulation are known to the person skilled in the art so that it no further details require explanation.

It may in particular be possible to determine the position in a reference coordinate system in which a position of the transmitter is also known. In particular it may actually be possible for the transmitters to be arranged location-fast, e.g. with respect to the reference coordinate system, and for the receiver to be arranged movable. For instance, the direction may be indicated as azimuth angle in a reference coordinate system with spherical coordinates, the origin of which forms one of the transmitters. Other definitions are possible.

Those techniques that include transmitting two or a plurality of em fields may permit particularly precise determination of the position of the receiver or they may permit two or three coordinates of the position of the receiver to be determined. The determined position may be displayed e.g. on a display for a user. This may also make it possible to find the receiver in a simple manner. In particular, by applying the techniques of triangulation, the result of precise position determination may be attained. It should be understood that the determination of a differential phase for the rotating em fields may occur relatively precisely, i.e. may have a relatively low error, in particular in comparison to conventional techniques that are based on a measurement of the field strength of the em field and in which the position determination is based on a damping rate of the amplitude of the em field. In particular, in many embodiments it may not be necessary to take this damping rate of the amplitude of the em field into consideration at all—for this reason it may also be unnecessary to detect the damping rate of the field strength of the em field in a calibration measurement described earlier. This may reduce the costs for performing the method for determining the position of the receiver. However, it should be understood that it is also possible, alternatively or in addition, to take into account the damping rate of the field strength of the em field. This may actually make possible particularly high precision in the position determination. In particular, the two or plurality of em fields may be transmitted such that they all rotate in one plane of rotation.

The method may furthermore include the determination of a field strength for the at least one electromagnetic field in the position of the receiver based on the measured at least one electromagnetic field, wherein the determination of the position of the receiver includes the determination of a distance between the receiver and a plane of rotation of the electromagnetic field based on the determined field strength.

It may be determined based on the field strength, e.g. qualitatively or quantitatively, whether the receiver is disposed above or below the plane of rotation. To this end in particular a coil may be provided as transmitter, which coil forms a specific angle with the plane that spans the other coils. That is, if the receiver is spaced apart from the plane of rotation, greater or smaller distances to the plane of rotation may cause smaller or greater field strengths at the same position within the plane of rotation (distance from transmitter, angle to transmitter). The amplitude of the magnetic field components, for instance, may be used as a measure of field strength. Alternatively or in addition, it may also be worthwhile, to determine a distance of the receiver merely above the plane of rotation based on the field strength. This may be the case if the transmitters are a small distance from the ground and the receiver is therefore necessarily spaced upwardly apart from the plane of rotation.

The method may furthermore include modulation of the at least one electromagnetic field for transmitting information to the receiver, wherein the information includes elements that are selected from the following group: timing information of a reference phase, identification information for the at least one transmitter.

It may be possible to use modulation techniques that are selected from the following group: frequency modulation (FM), phase modulation (PM), "frequency shift keying" (FSK), "phase shift keying" (PSK), pulse amplitude modulation (PAM), pulse-code modulation (PCM). In general other modulation techniques that are in principle known to one skilled in the art are possible.

The identification information may include e.g. information about a position of the specific transmitter. This position information may indicate e.g. where the specific transmitter is located with respect to the motor vehicle, for instance "in front to the right" or "to the left" or "in back to the right," etc. It is possible e.g. to transmit this position information explicitly or parameterized as a code that can be allocated to the positions e.g. via a table stored e.g. in the receiver.

In general it is possible for the various transmitted electromagnetic fields to have different modulation techniques and/or modulation frequencies for a plurality of transmitted electromagnetic fields. It is also possible for the different em fields to have the same modulation techniques, but different modulation frequencies. It is also possible to select modulation technique and modulation frequency the same for all em fields. The information transmitted may differ.

It is possible e.g. for each rotating em field to be generated by a plurality, e.g. three or four, em fields that are transmitted by individual coils at a pre-specified phase relationship. These em fields generating the rotating em field may themselves be modulated differently, e.g. in order to transmit different information.

Depending on the application of the method for determining the position of the receiver, a specific modulation technique and/or modulation frequency may be preferred; for example, the modulation technique during an application for determining the position of a motor vehicle key may be selected differently from an application for locating persons in the room of a building.

It may in particular be possible for the determination of the differential phase further to be based on the timing information of the reference phase. For instance, the differential phase may be determined relative to the reference phase. The timing information may have different information content depending on the embodiment. In one particularly simple embodiment it is possible for the timing information merely to indicate a null crossing (or whole number multiple of 360°) of the reference phase. However, in other different embodiments it may be possible for the reference phase to be transmitted in a time-resolved manner via the timing information. In this way it is possible to determine the current phase position or reference phase in a fraction of a rotation of the em field. Naturally it is also possible to transmit the reference phase in specific steps, for instance in intervals of $\pi/2$ or $\pi/4$ or $\pi/8$, etc.

The identification information may be used e.g. in applications that include an authentication of the receiver. For instance, during the position determination for a motor vehicle key, the identification information of the at least of the motor vehicle is compared to identification information of the receiver to prevent unauthorized access.

It may be possible for there to be a connection between the frequency of the em field and the decay rate of the field strength. Therefore it may be possible, depending on the frequency of the em field, to realize different size areas in which the position determination may take place—such areas may be determined via a field strength of the em field, which field strength is greater than a threshold (sensitive areas) so that in particular a signal-to-noise ratio is large enough in the measurement of the em field. A higher (lower) frequency may cause a lower (greater) decay rate of the field strength, and therefore make possible a larger (smaller) sensitive area, in different frequency areas, for instance the frequency areas cited above. The following explains how the method for position determination may make use of this information in different embodiments in accordance with the current aspect.

In accordance with another aspect, the invention relates to a method for determining a position of an identification transmitter for access control to a motor vehicle that in accordance with the method is configured for determining a position of a receiver in accordance with another aspect of the invention.

For instance, the identification transmitter may be a key of the motor vehicle. It is in particular possible for identification information that is transmitted to the identification transmitter for instance by modulating the electromagnetic field to be compared to identification information of the identification transmitter. This may serve as authentication or access control.

For such a method for determining the position of the identification transmitter, results may be attained that may comparably be attained with the results that may be attained for a method for determining the position of the receiver in accordance with another aspect of the invention.

In accordance with another aspect, the invention relates to a locating system for a receiver, wherein the locating system includes at least one transmitter that is set up to transmit a time-dependent electromagnetic field, wherein an amplitude of the electromagnetic field rotates relative to the transmitter as a function of the time. The locating system further includes the receiver, which is set up to measure the at least one time-dependent electromagnetic field. The locating system further includes a computer unit that is set up to perform the following steps: determine a differential phase for each of the at least one electromagnetic fields at the position of the receiver based on the measured at least one time-dependent electromagnetic field; and determine the position of the receiver based on the at least one determined differential phase.

For instance it is possible for the computer unit to be arranged within the receiver. However, it is also possible for the computer unit to be arranged outside of the receiver. It is also possible for parts of the steps of the computer unit to be executed within the receiver, for instance the determination of the differential phase, while other parts are executed outside of the receiver, for instance the determination of the position of the receiver. It is possible for the computer unit or functions of the computer unit to be implemented as hardware or software or a combination thereof and/or to be executed on different hardware units.

The locating system in accordance with the aspect currently being discussed may furthermore be set up for performing a method for determining a position of a receiver in accordance with another aspect of the present invention. For such a locating system, results may be attained that are comparable to the results that may be attained for the method for determining the position of the receiver in accordance with the other aspect of the invention.

In accordance with another aspect, the invention relates to a motor vehicle that includes a locating system for a receiver, wherein the locating system includes at least one transmitter that is set up for transmitting a time-dependent electromagnetic field, wherein one amplitude of the electromagnetic field rotates relative to the transmitter as a function of time. The locating system for the motor vehicle furthermore includes the receiver, which is set up to measure the at least one time-dependent electromagnetic field. The locating system of the motor vehicle further includes a computer unit that is set up to execute the following steps: determine a differential phase for each of the at least one electromagnetic field at the location of the receiver based on the measured at least one time-dependent electromagnetic field; and, determine the position of the receiver based on the at least one determined differential phase.

The features set forth above and features that are described in the following may be used not only in the explicitly described combination, but also in other combinations or in isolation without leaving the protective scope of the present invention. For instance, features and properties that were for example described with reference to the em field may be transferred to the additional em field with the additional frequency. Aspects of the different locating systems may also be transferred to the other locating systems, and to the aspect of the motor vehicle.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein:

FIG. 7A illustrates a phase relationship for a specific position of the receiver relative to rotating electromagnetic field generated by two coil arrangements, wherein FIG. 7A is a top view of a plane of rotation in which the electromagnetic field rotates;

FIG. 7B illustrates a side view of FIG. 7A and illustrates the distance between the receiver and the plane of rotation of the rotating electromagnetic field;

DETAILED DESCRIPTION

The present invention is explained in greater detail in the following using exemplary embodiments and referencing the drawings. Techniques for locating or determining a position are explained using the figures; various aspects relate to coils and coil arrangements that make it possible to transmit a rotating electromagnetic field, relate to locating systems that include a plurality of such coil arrangements and a specific system architecture, and also relate to the fundamental techniques that make it possible to determine the position using the rotating magnetic fields.

Figure 1:
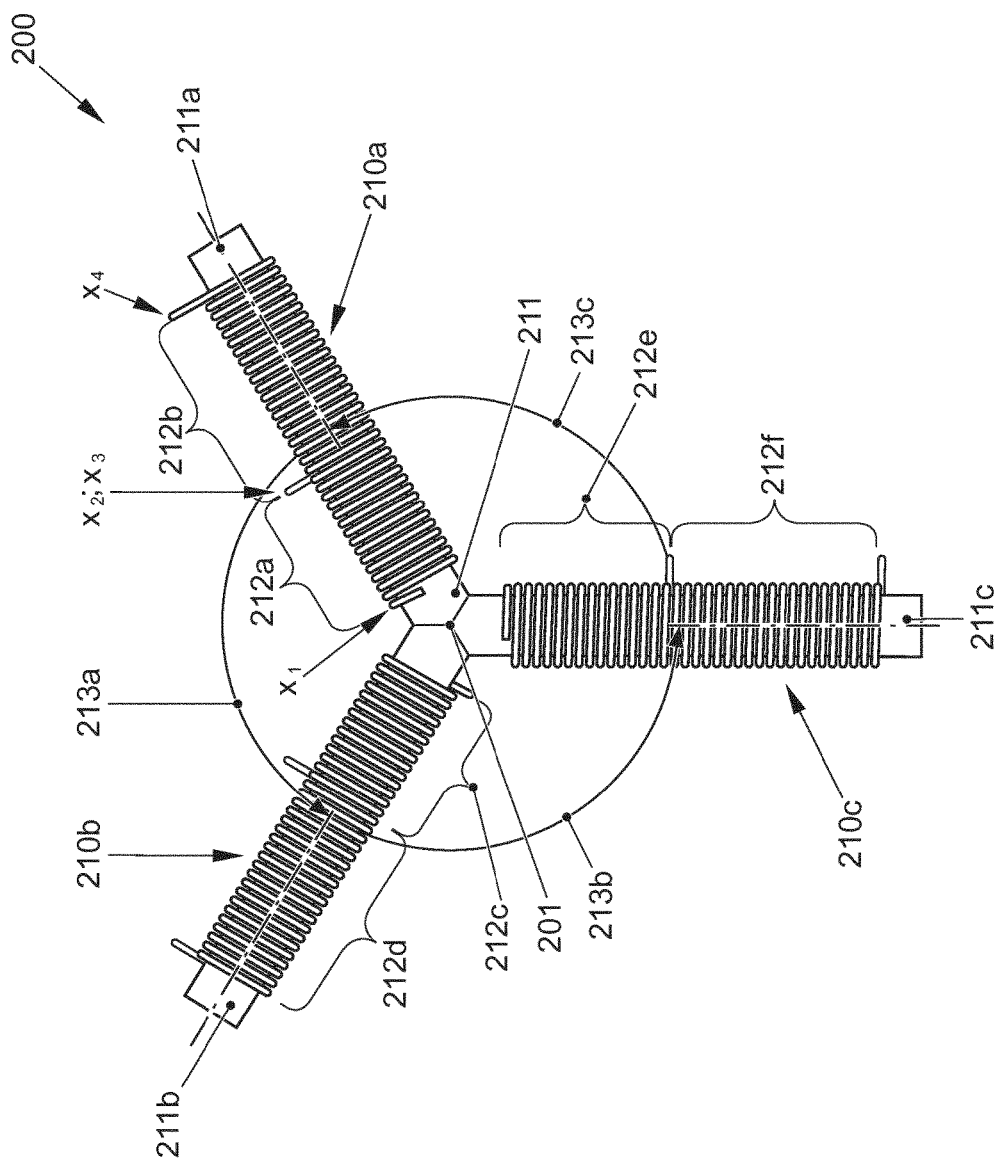
FIG. 1 is a top view of a coil arrangement for a locating system, wherein the coil arrangement has three coils, each having two coil windings.

FIG. 1 depicts a view of a coil arrangement that includes three coils 210a, 210b, 210c. The coil 210a has two coil windings 212a, 212b. The coil 210b has two coil windings 212c, 212d. The coil 210c has two coil windings 212e, 212f. The coil windings 212a-212f are each wound about one of three arms 211a, 211b, 211c of a ferromagnetic coil yoke 211 and may be electrically contacted separately. The coil yoke may comprise e.g. iron, nickel, chromium, oxides, or alloys of these materials. The arms 211a, 211b, 211c have a circular cross-section and are therefore cylindrical. They may have a diameter of 3 mm-30 mm, preferably 6 mm. The shape of the arms is variable. They extend radially from a center of the coil arrangement 200. The coil yoke is continuous and therefore in particular does not have any large holes or gaps; thus a magnetic coupling (in the form of a ferromagnetic exchange interaction that causes a large magnetic flux) may form between the three coils 210a, 210b, 210c. A different number of windings may be selected depending on the desired inductivity (and thus the frequency of the electromagnetic field).

The magnetic flux may assume different value at different points of the coil arrangement 200. These values may be pre-specified using the structure of the coil arrangement 200. For example, the magnetic flux may assume a value of zero or near zero, i.e. a very low value, in the center of the coil arrangement 200.

Figure 2B:
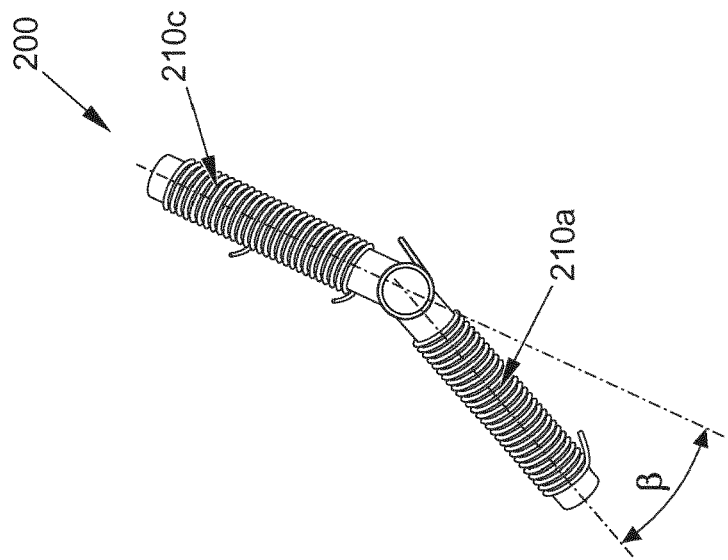
FIG. 2B is a side view of the coil arrangement from FIG. 2A.
Figure 2A:
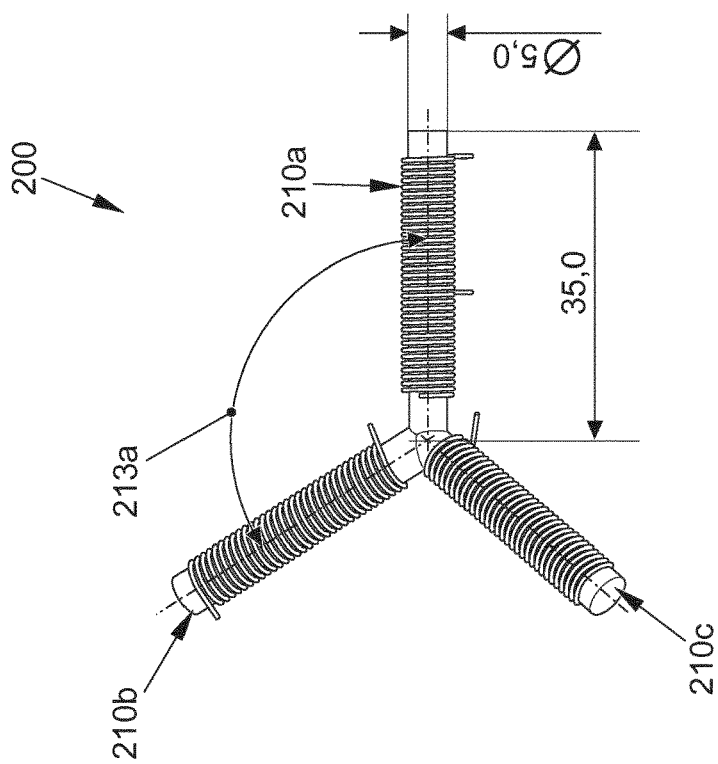
FIG. 2A is a side view of the coil arrangement as in FIG. 1, in which a coil is tilted relative to a coil plane.

As may be seen from FIG. 1, the coils 210a, 210b, 210c all lie in one plane. FIGS. 2A and 2B depict an alternative embodiment in which the coil 210c is tilted with respect to this plane (coil plane) by an angle R. In this way it is possible to attain small dimensioning of the coil arrangement 200 in the coil plane. The angle β may be in a range of 20°-30°.

Again referring to FIG. 1, the coil 210a and the coil 210b form an angle 213a. The coil 210b with the coil 210c form an angle 213b. The coil 210c with the coil 210a form an angle 213c. These angles 213a, 213b, 213c each extend within the coil plane. In the embodiment in FIG. 1, these angles 213a, 213b, 213c are the same size, that is, they are 120°. In other words, the coil arrangement 200 in FIG. 1 has a star-shaped configuration. Although FIG. 1 depicts a very symmetrical embodiment, in general it is also possible for the various angles 213a, 213b, 213c to be different—this may in particular be worthwhile when a structure of the coil arrangement 200 is subject to certain limitations due to structural constraints. The angles 213a, 213b, 213c are not specially limited and may be very different. For example, the angles 213a-213b-213c may be respectively as follows: 180°-90°-90°; 200°-80°-80°; 160°-100°-100°.

As FIGS. 2A and 2B depict, individual coils 210c may be tilted out of the coil plane. The lateral dimensions of the coil arrangement 200, i.e. the dimensions within the coil plane that is spanned by the coils 210a, 210b, may be reduced because of this. However, since one component of the time-dependent electromagnetic field generated by the coil 210c is still within the coil plane, the coil arrangement 200 in FIGS. 2A and 2B may generate an electromagnetic field that is comparable to the electromagnetic field of the coil arrangement 200 in FIG. 1.

While each of FIGS. 1, 2A, 2B depict cases in which the coil arrangements 200 include three coils 210a, 210b, 210c, in general it is also possible to use more coils. For instance, an embodiment is possible in which the coil arrangement 200 includes four (six) coils that each form an angle of 90° (60°) to one another within the coil plane.

The foregoing referred primarily to structural features of the coil arrangement 200. The following explains how it is possible to generate a rotating electromagnetic (em) field by means of such coil arrangements 200. The rotating em field is generated by overlaying the em fields transmitted by the individual coils 210a, 210b, 210c. The rotating em field may indicate such a field in which points of the same phase of the em field rotate, as a function of time, about the coil arrangement 200 (approximately its center point 201, see FIG. 1).

Figure 3:
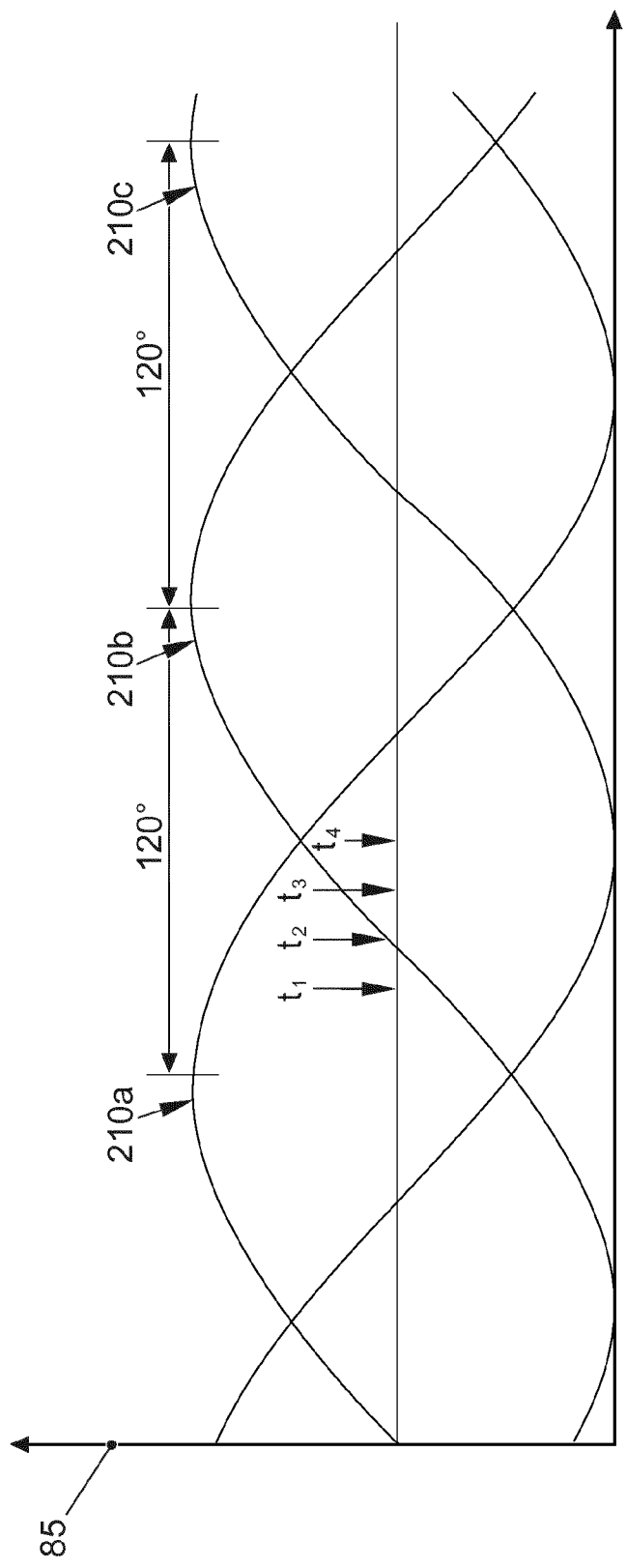
FIG. 3 depicts the current through the coils of the coil arrangement in FIG. 1 as a function of time, wherein the current is generated by an alternating voltage.

For generating an em field, the coils 210a-210c are actuated, together with a capacitor (not shown in FIGS. 1-3), as an oscillating circuit. With respect to FIG. 3, first an embodiment will be discussed in which all of the coils 210a, 210b, 210c of the coil arrangement 200 in FIG. 1, i.e. the windings 212a, 212b, and 212c, 212d and 212e, 212f combined, are supplied current. In FIG. 3 the current flow 85 through the coils 210a, 210b, 210c is shown as a function of time. Such a current flow may be attained using an appropriate alternating voltage. As may be seen from FIG. 3, the alternating voltages/the current flow 85 have a phase difference of 120°—that is, corresponding to the angles 213a, 213b, 213c. The alternating voltage 85 may be generated e.g. by a current-voltage converter that connects the coil arrangement 200 to a 12V direct voltage electrical system of a motor vehicle. The alternating voltage 85 may then be applied to the innermost and outermost contacts of an arm associated with each of the coils 210a-210c.

Figure 4:
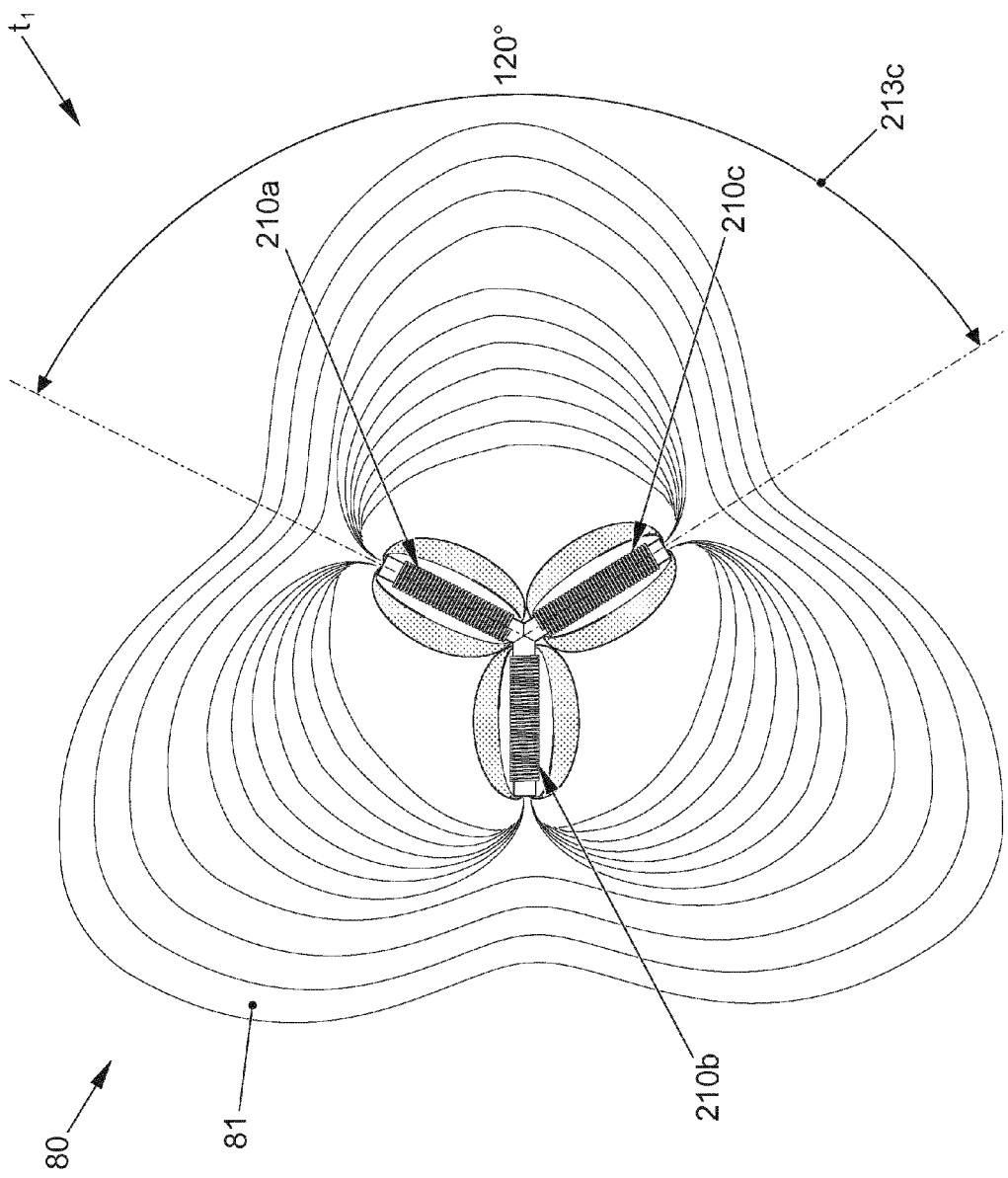
FIG. 4 is an isocontour plot of the amplitude of the magnetic field component of the electromagnetic field generated by the coil arrangement in FIG. 1 at a specific point in time.

Feeding current to the coils 210a, 210b, 210c in this manner causes an electromagnetic field 80, as is illustrated by the amplitude 81 of the magnetic field component illustrated in FIG. 4. FIG. 4 depicts the em field 80 at time t1. The electromagnetic field has a symmetry that corresponds to that of the coil arrangement. The plot in FIG. 4 represents the em field 80 in particular within the coil plane.

It should be understood that it is possible to generate an electromagnetic field 80 identical to the one shown in FIG. 4 even with other configurations of the coil arrangement 200 that are different from that depicted in FIG. 1. For instance, if the angles 213a-213c of adjacent coils 210a 210b, 210c are different from the 120 in FIG. 1, the alternating voltage 85, in particular a phase shift, may be adjusted as appropriate (see FIG. 3). This can compensate the change in the adjacent angles 213a, 213b, 213c and maintain a situation as illustrated in FIG. 4. The same applies if individual coils 210c are tilted out of the coil plane, as depicted in FIG. 2. It may be possible to take into account the projection of the coil 210c into the coil plane.

Figure 5:
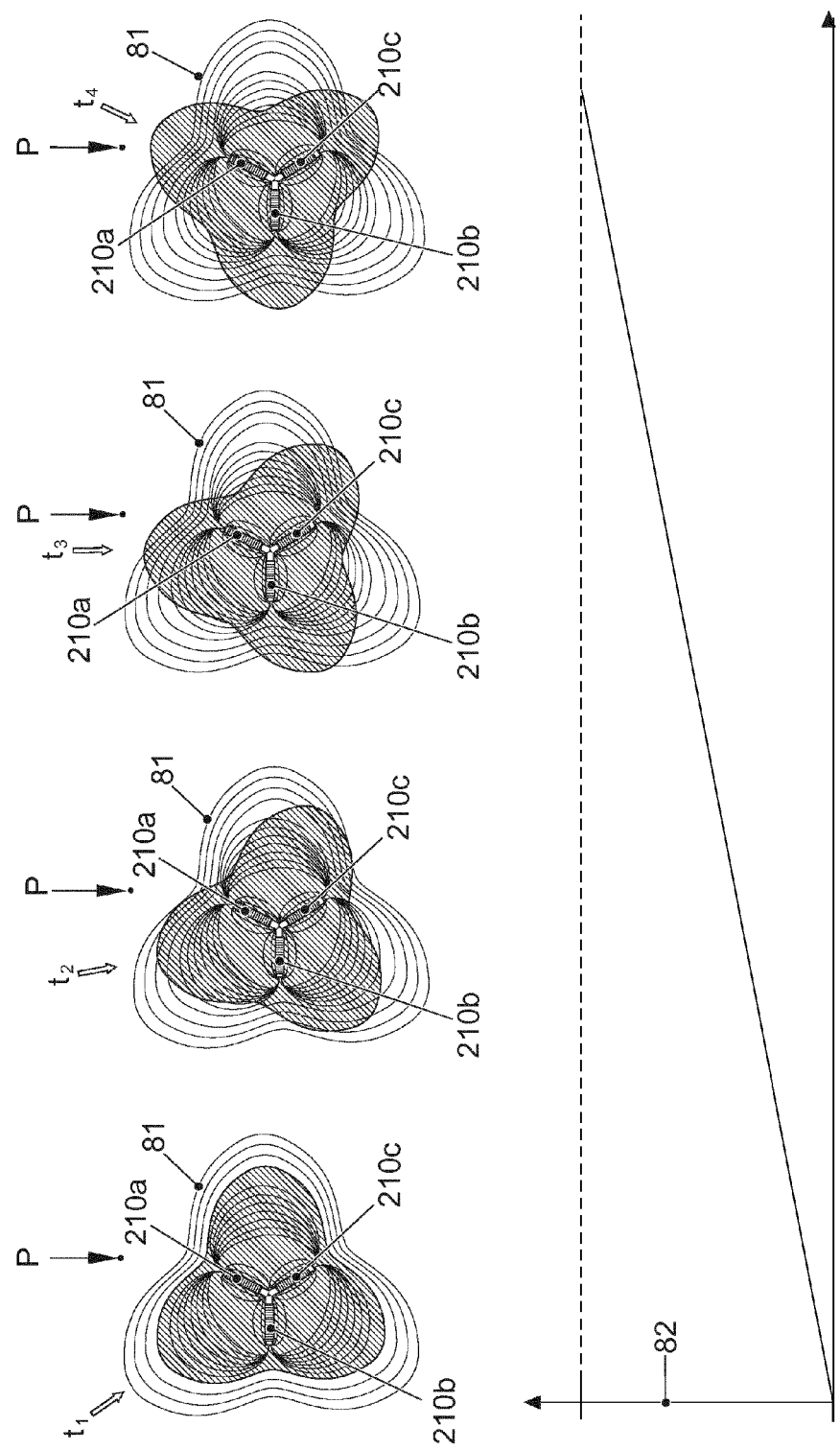
FIG. 5 illustrates the rotation of the electromagnetic field of the coil arrangement in FIG. 1 by means of the temporal evolution of isocontour plots of the amplitudes of the magnetic field component.

With reference to FIG. 5, the following shall discuss the rotation of the em field 80 as a function of time, i.e. the rotating em field 80 shall be explained. The em field 80 is depicted at four different points in time t1, t2, t3, t4 (see also FIG. 3). In addition, the phase 82 of the rotating em field 80 is illustrated at the bottom of FIG. 5. An increase in the phase 82 as times increase is evident (phase accumulation). As may be seen from FIG. 5, the em field 80 rotates about the coil arrangement 200 and within the coil plane. The coil plane is therefore coincident with the plane of rotation. While FIG. 5 depicts a situation in which the em field 80 has a constant amplitude as a function of the angle/phase, the amplitude 81 of the em field 80 may also depend on the phase, e.g. as a function of the structure of the coil arrangement 200. The three-phase motor may be considered a graphic analogy to how the coil arrangement 200 functions for generating the rotating em field 80.

Figure 6:
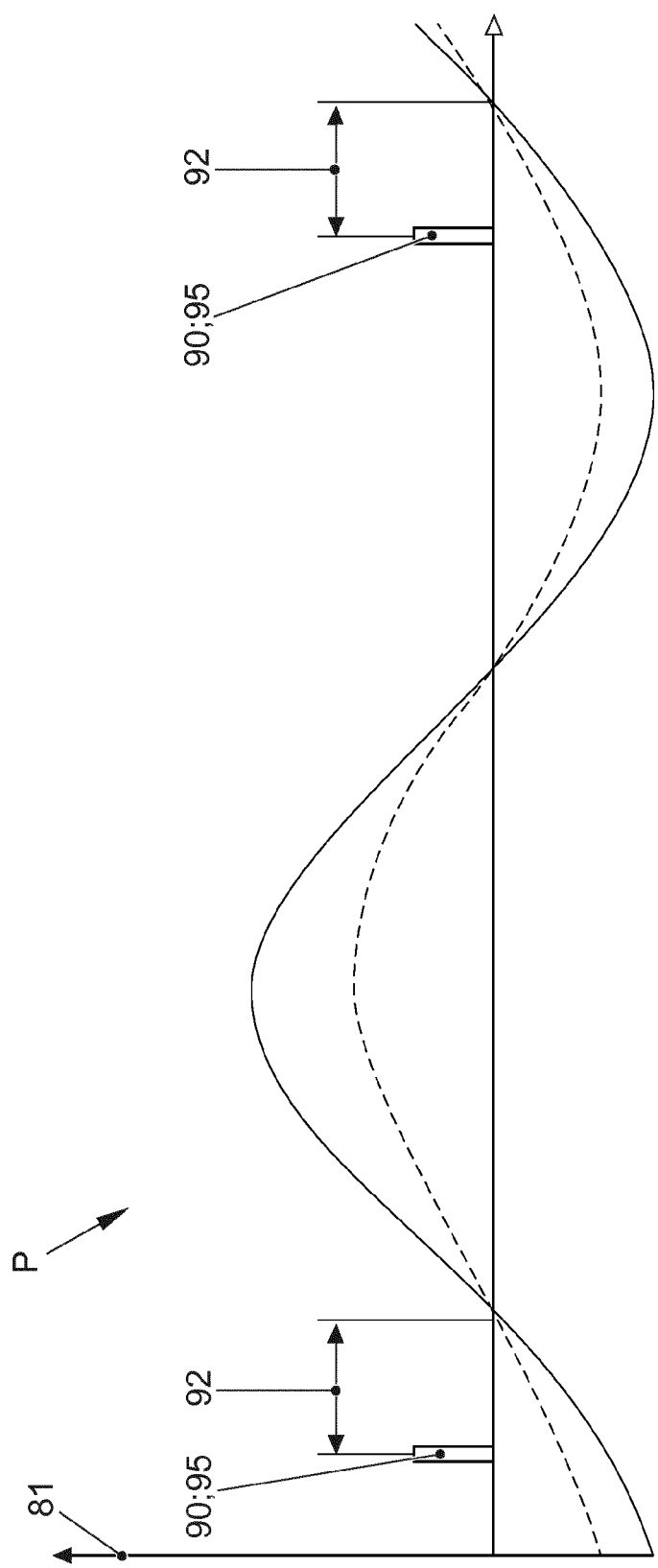
FIG. 6 depicts a measured amplitude of the magnetic component of the rotating electromagnetic field in FIG. 5 on a point spaced apart from the transmitter within the plane of rotation as a function of time.

FIG. 6 plots a measurement of the amplitude 81 of the magnetic field component of the em field 80 at a point P (see also FIG. 5) in the outside area of the coil arrangement 200 and within the plane of rotation as an example. FIG. 6 further depicts the amplitude 81 for a point P' (broken line) that is spaced apart from the plane of rotation and whose projection into the plane of rotation is coincident with the point P. The difference in amplitude 81 between points P and P' is a measure for the distance between the point P' and the plane of rotation. The amplitude 81 is proportional to a field strength of the em field 80. As may be seen, the amplitude varies in a sinusoidal shape (solid line). It is possible to determine a differential phase 92 relative to a reference phase 90. For example, the reference phase 90 may be transferred with timing information 95 by modulating the em field 80.

Modulation techniques selected from the following group may be used for modulating the em field 80: frequency modulation (FM), phase modulation (PM), "frequency shift keying" (FSK), "phase shift keying" (PSK), pulse amplitude modulation (PAM), pulse code modulation (PCM). In general other modulation techniques as they are in principle known to one skilled in the art are possible. In principle it is also possible to modulate the different components of the em field 80 that are generated by the different coils 201a, 210b, 210c with a different modulation technique and in particular modulation frequency.

The timing information 95 in particular may also be transferred by separate modulation of the em fields 80 transmitted by the different coils 201a, 210b, 210c. In other words, this may mean that the phase of the em field 80 may be transferred in a time-resolved manner. Then it may be possible to determine the differential phase 92 simply from the fraction of an entire rotation of the em field 80, for instance from ⅓ or ⅔ of a rotation (in the case of 3 coils having angle 213a, 213b, 213c for 120°).

It is possible to determine a position of a receiver using the operation of the individual coil arrangement 200. Position may indicate different levels of information; for instance, it is possible to determine from the differential phase 92 the position in relation to an azimuth angle in the plane of rotation relative to the coil arrangement 200. However, in accordance with various aspects, it is also possible to determine the position more precisely in that two or more coil arrangements are used (see FIG. 7A). More precisely may mean that in addition to the azimuth angle, a distance and/or a polar angle is determined in addition or alternatively. The different coordinates may be represented differently in different coordinate systems.

It is also possible to determine the position, not in a spherical coordinate system (distance, azimuth angle, polar angle), but in any other desired coordinate system. The position may be determined in particular in a reference coordinate system. The reference coordinate system may usefully be determined with respect to the positions of the coil arrangement(s) 200 or e.g. with respect to a motor vehicle in which the coil arrangement(s) 200 are installed.

In FIG. 7A, two coil arrangements 200a, 200b are used, e.g. in the context of such a locating system, for determining the position P of a receiver 30, e.g. an identification transmitter like a key to a motor vehicle. The receiver 30 is set up for measuring the rotating em field 80 of the two coil arrangements 200a, 200b. To this end the receiver may have e.g. one or a plurality of receiver coils (not shown in FIG. 7A). The receiver is furthermore set up for determining the differential phase 92 therefrom. As may be seen from FIG. 7A, the receiver 30 has different differential phases 91 for the em fields 80 of the two coil arrangements 200a, 200b. If both differential phases 92 are determined and if the distance between the coil arrangements 200a, 200b is known, the exact position of the receiver 30 within the plane of rotation of the em fields 80 may be determined, e.g. by means of triangulation. The position may be characterized by the direction A and the distance a e.g. from the coil arrangement 200a.

It is possible to attain even greater precision in the determination of the position P of the receiver 30. This may occur in that, in addition to the differential phases 92, a field strength of the electromagnetic field 80 or a variable proportional thereto is also measured by the receiver. That is, by also measuring the field strength, i.e. for instance the amplitude of the magnetic component of the electromagnetic field, it may be possible to determine a vertical distance a' between the receiver 30 and the plane of rotation. FIG. 7B illustrates this with the vertical arrow (side view in FIG. 7A). That is, if the receiver 30 is at a position P' above or below the plane of rotation 300 of the rotating electromagnetic fields 80, it is possible to unambiguously determine a projection of the position of the receiver 30 into the plane of rotation 300 using the triangulation described in the foregoing based on the differential phases 92. The field strength of the em field 80 may then be greater or smaller depending on the vertical distance between the receiver 30 and the plane of rotation 300 (see broken line in FIG. 6).

If additional coil arrangements are used in addition to the two coil arrangements 200*a*, 200*b*, uncertainty in the position determination may be reduced, e.g. an error in the triangulation may be determined. Although in the foregoing techniques for determining the position of the receiver 30 relative to two coil arrangements 200*a*, 200*b* was discussed with reference to FIGS. 7A and 7B, it should be understood that in general it is possible to use more than two coil arrangements 200*a*, 200*b*. For instance, if three, four, or five coil arrangements are used, it may be possible to reduce an error in the determination of the position of the receiver 30. The plurality of em fields 80 may be transmitted sequentially or one after the other at different points in time (time multiplexing) or at least some may be transmitted simultaneously at different frequencies (frequency multiplexing). In this way the receiver 30 may allocate the appropriate em field 80 to one of the coil arrangements 200*a*, 200*b*.

Figure 8A:
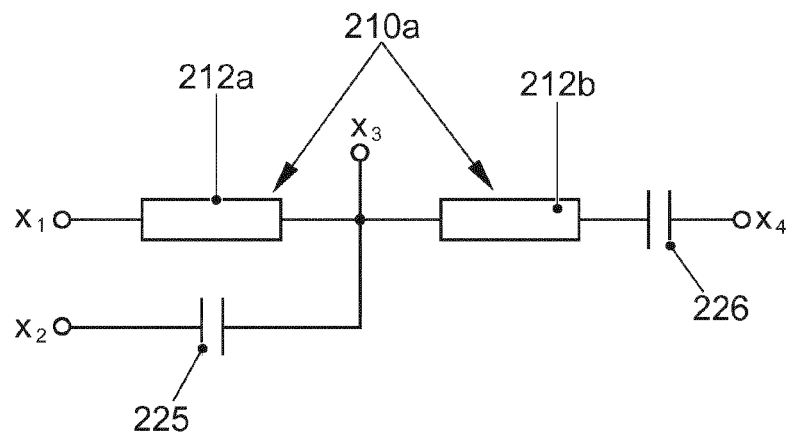
FIG. 8A illustrates an electrical circuit of a coil that includes two coil windings and two capacitors.

FIG. 8A depicts electrical circuitry for the coil 210*a*. In particular the two coil windings 212*a*, 212*b* may be seen. The two coil windings 212*a*, 212*b* may be operated coupled by contacting with the contacts x1 and x4 (see also FIG. 1). A capacitor 226 is connected in series with the two coil windings 212*a*, 212*b*. However, it is also possible to operate the coil windings 212*a* alone. To this end, another capacitor 225 is provided connected in parallel with the coil winding 212*a*.

If the coil windings 212*a*, 212*b* are operated coupled, inductivity of the coil 210*a* is greater if only the coil winding 212*a* is operated. Therefore a resonance frequency for the former case may especially be lower than a resonance frequency for the latter case. For instance, the resonance frequency when the coil 210*a* is operated with the two coil windings 212*a*, 212*b* may be selected using suitable dimensioning of the inductivities and of the capacity of the capacitor 226 such that it is 125 kHz. Correspondingly, a resonance frequency for operation of the coil 210*a*, which includes only the coil winding 212*a* and the other capacitor 225, may be selected equal to 1 MHz. Naturally it is possible to produce other frequencies using suitable dimensioning of the capacities and inductivities. One skilled in the art will be familiar with a number of techniques.

In general power consumption when transmitting the em field may be greater for the series connection with the capacitor 226 than for the parallel connection with the other capacitor 225. In certain applications, for instance for a search of the surroundings of a receiver in the far range. Actuation of the parallel connection with the other capacitor 224 at preferably 1 MHz may include e.g. a non-rotating em field. Such a scenario is characterized by low electrical power consumption, which may be preferable e.g. for proximity detection in the distant surroundings, i.e. for distant ranges of up to 10 m from the motor vehicle 1. If the identification transmitter 30 is recognized in these distant surroundings, the series connection with the capacitor 226 may then be activated. In this mode of operation the position and position course of the identification transmitter 30 in the near range, e.g. up to 3 m from the motor vehicle 1, may be determined. Such hierarchical operation may bring about lower energy consumption, which may be worthwhile especially in electric vehicles.

Figure 8B:
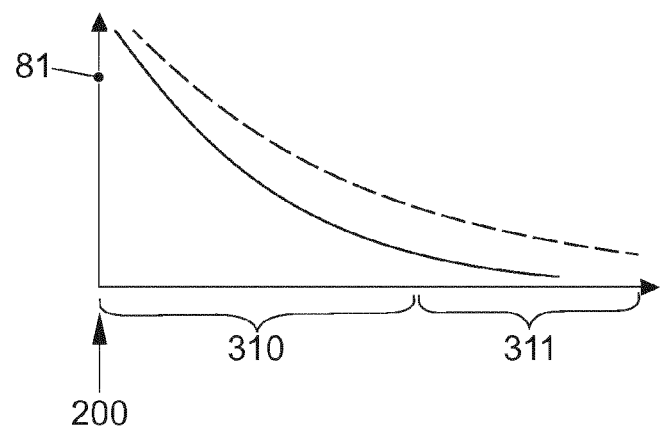
FIG. 8B illustrates a decay rate of the field strength of the electromagnetic field for different modes of operation for the electrical circuit in FIG. 8A or for different frequencies.

A decay rate for the electromagnetic field 80 may be a function of the frequency in a frequency range that includes the aforesaid frequencies. Thus higher frequencies cause a lower decay rate for the electromagnetic field 80. This is depicted in FIG. 8B. FIG. 8B plots the amplitude 81 for instance of the magnetic component of the electromagnetic field 80 over the location as distance from the transmitting coil arrangement 200. The solid (broken) line illustrates the case of a comparatively low (high) resonance frequency for the corresponding oscillating circuit as was discussed in the foregoing with respect to FIG. 8A. As may be seen from FIG. 8B, a decay rate for the electromagnetic field 80 is lower for higher resonance frequencies. Therefore it may be possible to determine the position of the receiver 30 in a far range 311 (near range 310) of the coil arrangement 200 by providing current only to one (both) coil winding(s) 212*a* (212*a*, 212*b*).

Figure 8C:
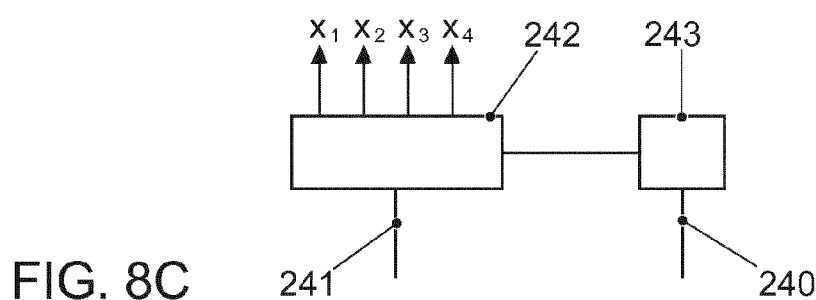
FIG. 8C schematically illustrates an alternating voltage source that is connected to a vehicle electrical system and the coils of the coil arrangement.
Figure 9A:
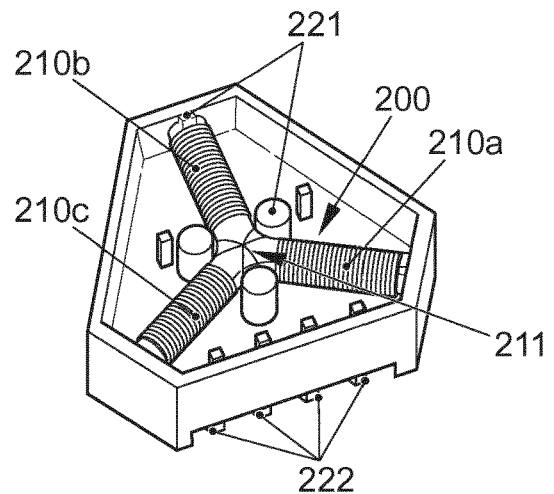
FIG. 9A is a perspective elevation of the coil arrangement from FIG. 1 in a housing.
Figure 9B:
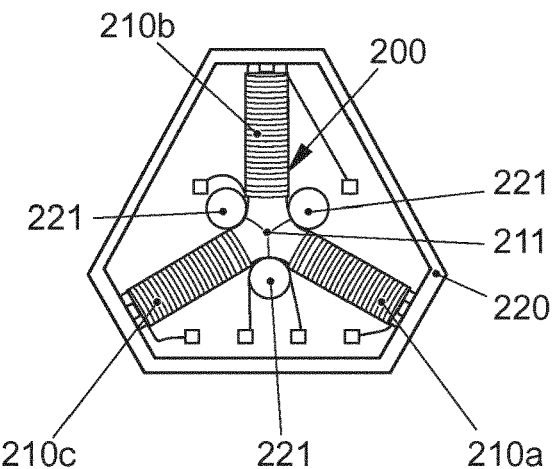
FIG. 9B is a view from above of the coil arrangement with the housing from FIG. 9A.
Figure 9C:
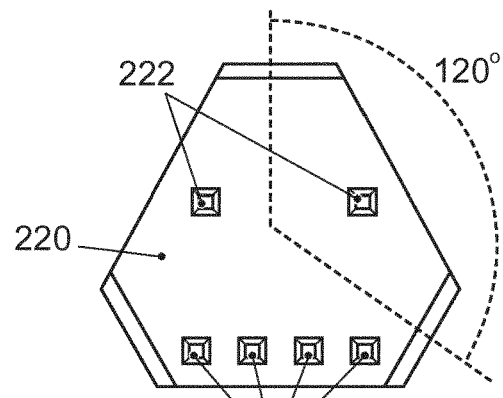
FIG. 9C is a view from below of the coil arrangement with the housing from FIG. 9A.
Figure 9D:
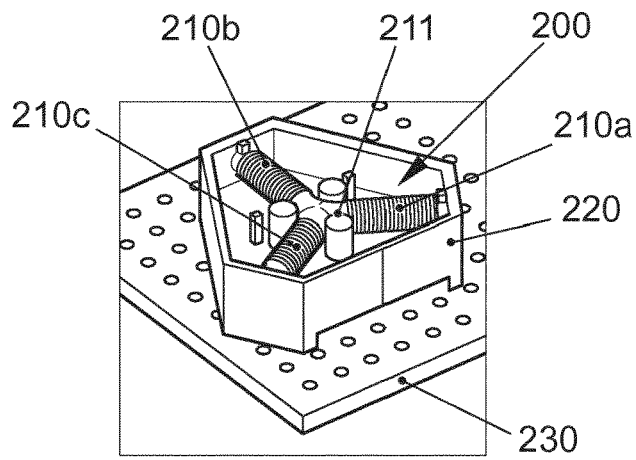
FIG. 9D is a perspective elevation of the coil arrangement from FIG. 9A, wherein the coil arrangement is attached to a circuit board.
Figure 9E:
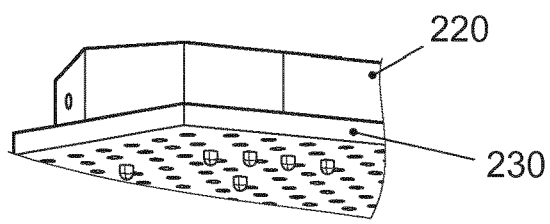
FIG. 9E is another perspective elevation of the coil arrangement from FIG. 9A, wherein the coil arrangement is attached to a circuit board.
Figure 9F:
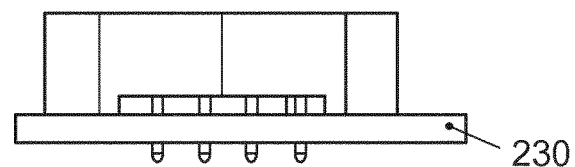
FIG. 9F is a side view of the coil arrangement from FIGS. 9D and 9E.
Figure 10A:
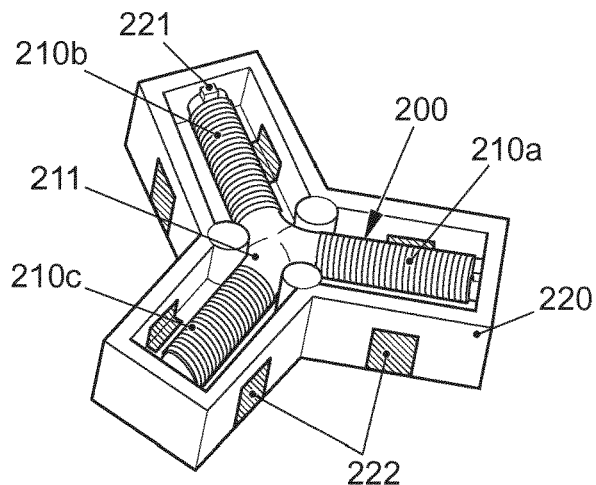
FIG. 10A is a perspective elevation of the coil arrangement from FIG. 1 with an alternative embodiment of the housing.
Figure 10B:
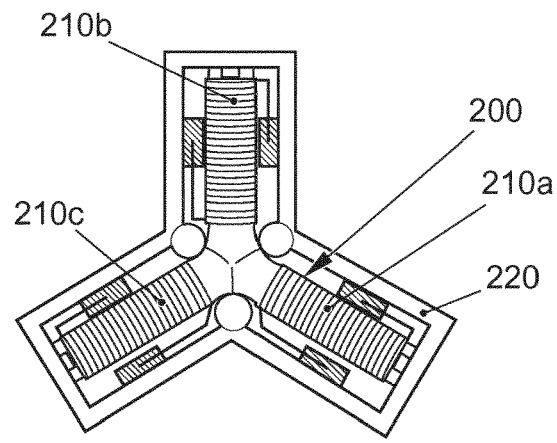
FIG. 10B is a view from above of the coil arrangement with the alternative embodiment of the housing from FIG. 10A.
Figure 10C:
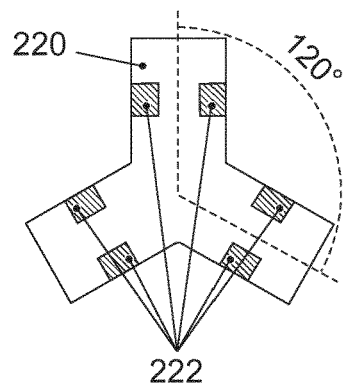
FIG. 10C is a view from below of the coil arrangement with the alternative embodiment of the housing from FIG. 10A.
Figure 10D:
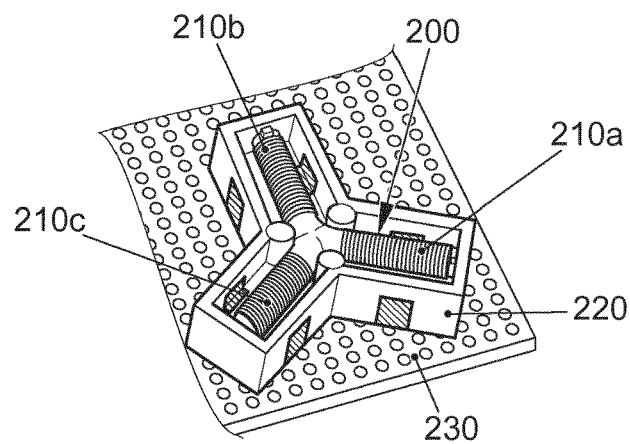
FIG. 10D is a perspective elevation of the coil arrangement from FIG. 1 with the alternative embodiment of the housing, wherein the coil arrangement is attached to a printed circuit board.
Figure 10E:
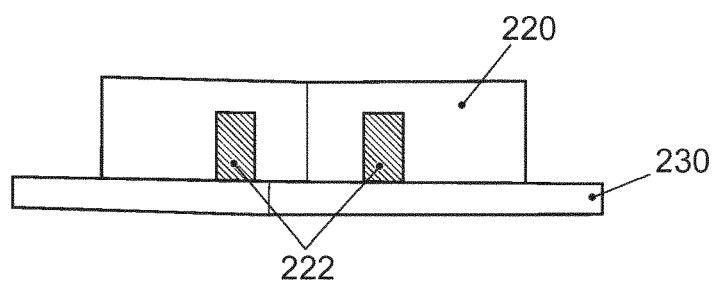
FIG. 10E is a side view of the coil arrangement from FIG. 1 having the alternative embodiment of the housing, wherein the coil arrangement is attached to a printed circuit board.

FIG. 8C is a schematic depiction of an alternating voltage source 242 connected to a power supply line 241. The power supply line 241 may be e.g. a 12 V direct voltage system of a motor vehicle. The alternating voltage source 241 is set up to generate an alternating voltage as illustrated in FIG. 3. FIG. 8C furthermore depicts a computer unit 243 that is set up to receive control signals via a bus system 240 and based thereon to control the transmission of the em field 80.

FIGS. 9A-9F and 10A-10D provide various views of the coil arrangement 200 from FIG. 1 in a housing 220. The capacitors 225, 226 and other power electronics may also be arranged inside the housing. Electrical contacts 222 that may connect the coil arrangement to conductors on a printed circuit board 230 are depicted. For instance, the contacts may be connected to the alternating voltage source 242 via conductors on the printed circuit board. Moreover, retention elements 221 are provided that fix the coil arrangement 200 location-fast inside the housing 220. The housing can represent protection against shock, deposits, moisture, etc. and may preferably be made of plastic. A top side of the housing 220 is not shown for reasons of clarity but may be provided. As may be seen from FIGS. 9A-9F, a top side and bottom side of the housing and the printed circuit board 230 may be parallel to the plane of rotation 300 or the coil plane. The special housing shape is not limiting and may be selected to be different. It should be understood that different housings 220 may be preferred depending on the installation space available. The housing may be attached oriented parallel to the ground.

Figure 11:
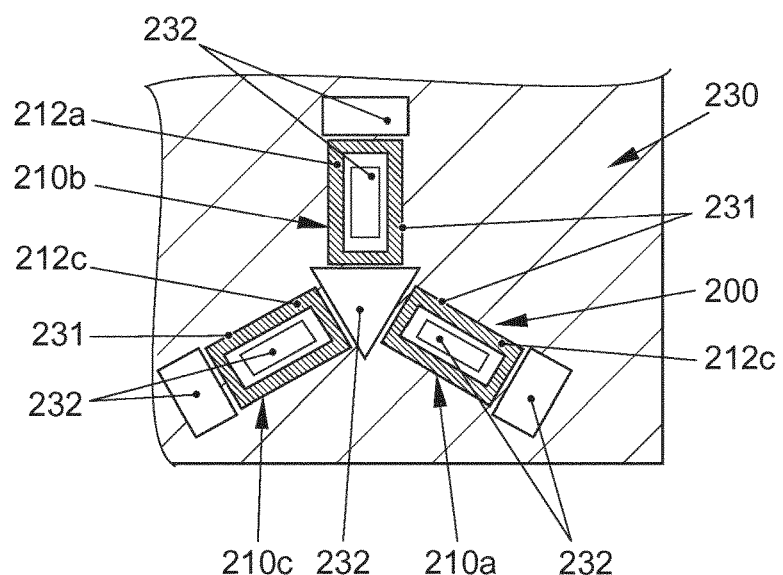
FIG. 11 is a view of an embodiment of the coil arrangement that has been integrated on a printed circuit board and in which the coils are embodied by conductors.

FIG. 11 depicts an alternative embodiment of the coil arrangement 200. This embodiment is an integrated structure in which conductors 231 form the coil windings 212*a*, 212*c*, 212*e* in a planar manner on a printed circuit board 230 (broken). The conductors may be produced e.g. using etching or masking or lithography techniques.

Provided in the printed circuit board 230 are recesses 232 into which the coil yoke 211 (not shown in FIG. 11) may be inserted and fixed. This embodiment may result in a particularly low space requirement.

In the following a system architecture of a locating system 100 that includes at least two coil arrangements 200, 200*a*, 200*b* shall be explained using FIGS. 12-14. Using techniques as were described with reference to FIGS. 7A and 7B in the foregoing, the locating system 100 may precisely determine a position of the receiver 30, for instance a key to a motor vehicle. The position determination may take place relatively precisely both outside of and in the interior of the motor vehicle, e.g. down to a few centimeters. For instance, the determined position of the key may be depicted graphically to the user, for instance on a screen of a computer for the motor vehicle 1. To this end rotating em fields may be generated.

Figure 12:
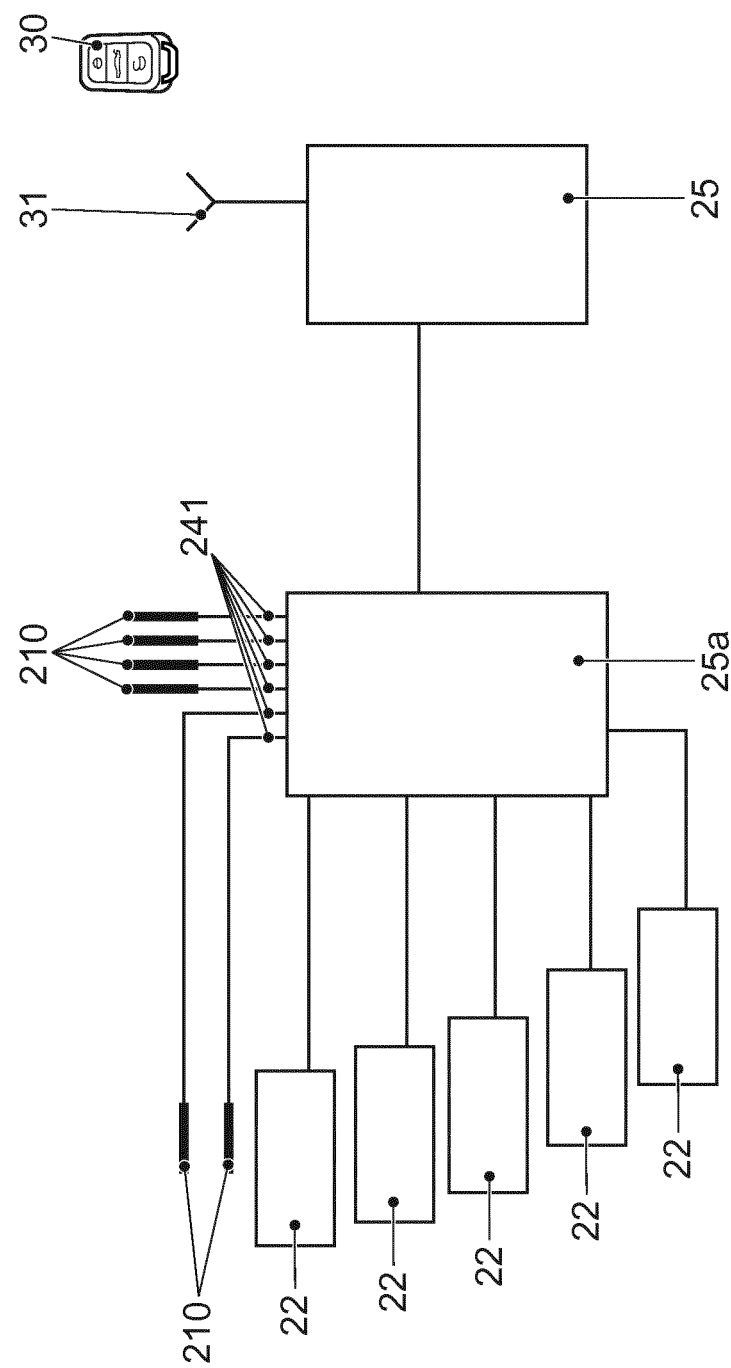
FIG. 12 is a schematic drawing of a previously known locating system for an identification transmitter of a motor vehicle.

First, FIG. 12 depicts a previously known locating system 100. A control device 25 is connected to another control device 25a. The control device 25 may for instance be part of a central processing unit for the motor vehicle. In addition, the control device 25 is connected to a wireless interface 31 that can establish data transmission with the identification transmitter 30. The other control device 25A is connected to door handle sensors 22 of the motor vehicle via data lines. These door handle sensors 22 may detect actuation or desired access to closed elements of the motor vehicle, for instance doors or hatchbacks. In addition, the other control device 25a is connected via power supply lines 241 to individual coils 210 for generating electromagnetic fields that may be measured by the identification transmitter 30. As may be seen from FIG. 12, the system architecture of the previously known locating system has a relatively complex configuration. In particular the for instance two core power supply lines 241 must be provided in great numbers, which necessitates complicated wiring of the vehicle: the control device 25a includes an alternating voltage source that supplies the coils 210 with voltage via the line 241a.

Figure 13:
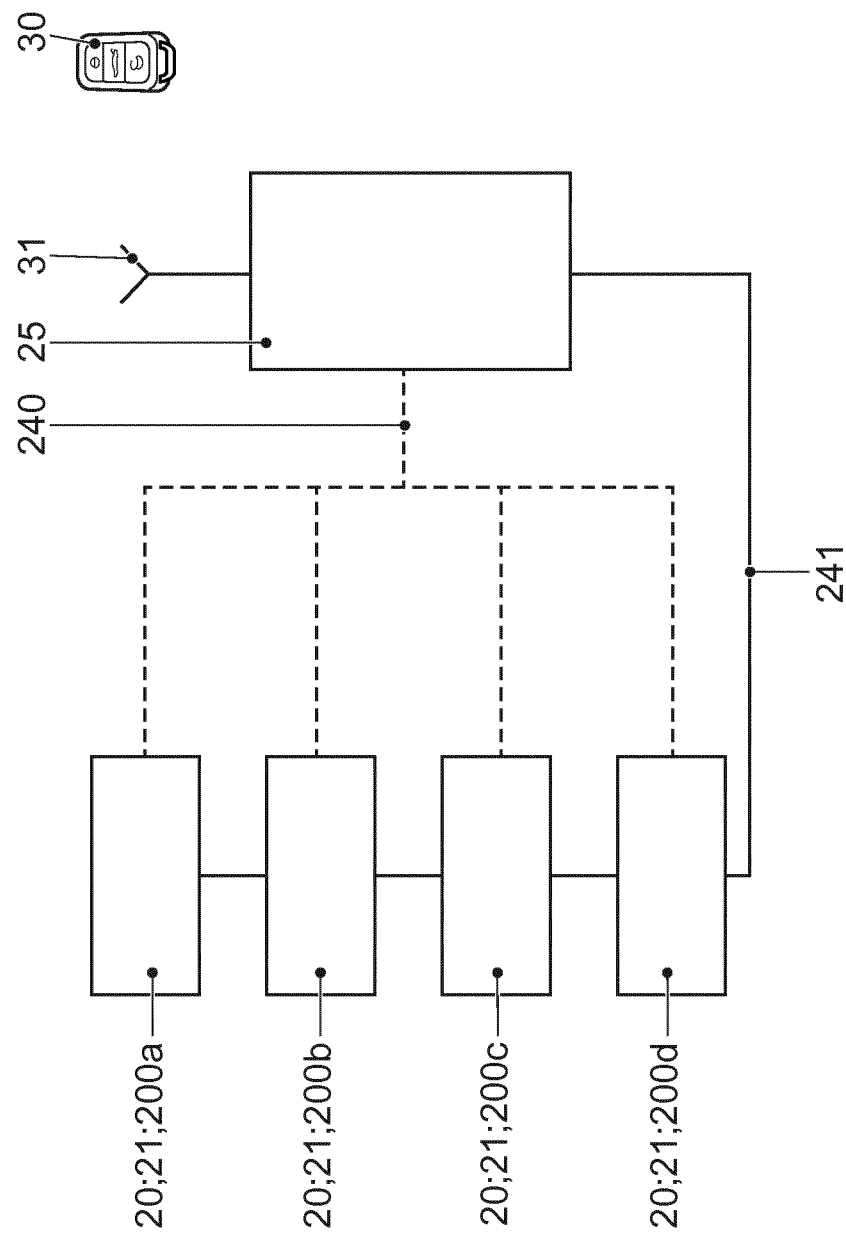
FIG. 13 is a schematic drawing of an inventive locating system for an identification transmitter of a motor vehicle.

FIG. 13 is a schematic depiction of the inventive locating system 100.

Four coil arrangements 200a-200d, as well as capacitive sensors 20 and optical sensors 21, are provided. The coil arrangements 200a-200d may be connected via a computer unit (not shown in FIG. 13) to a bus system 240 that enables data communication with the control device 25. The bus system may be e.g. a controller area network (CAN) bus system, local interconnect network (LIN), "FlexRay," or other bus system. The control device 25 may send commands via the bus system 240, which commands are received and interpreted by the computer unit of the specific coil arrangement 200a-200d. Then the coil arrangements 200a-200d are set up to generate a rotating em field 80 as a reaction to the control signals. The energy required for this may be obtained from the power supply line 241. For instance, the power supply line may provide direct voltage (for instance 12 V) so that a corresponding electrical circuit, that is an alternating voltage source, is set up in the coil arrangements 200a-200d in order to generate therefrom the alternating voltages, with pre-specified phase relationship, required for generating the em field 80. For instance, the control unit 25 may actuate the coil arrangements 200a-200d such that the em fields 80 are transmitted at different times (time multiplexing) and/or at different frequencies (frequency multiplexing). A position of the receiver 30 may then be determined with the techniques that were described with reference to FIGS. 7A and 7B. The locating system 100 in FIG. 13 may have a more rapid reaction time compared to the system in FIG. 12 because there is no interposed control device 25a.

Figure 14:
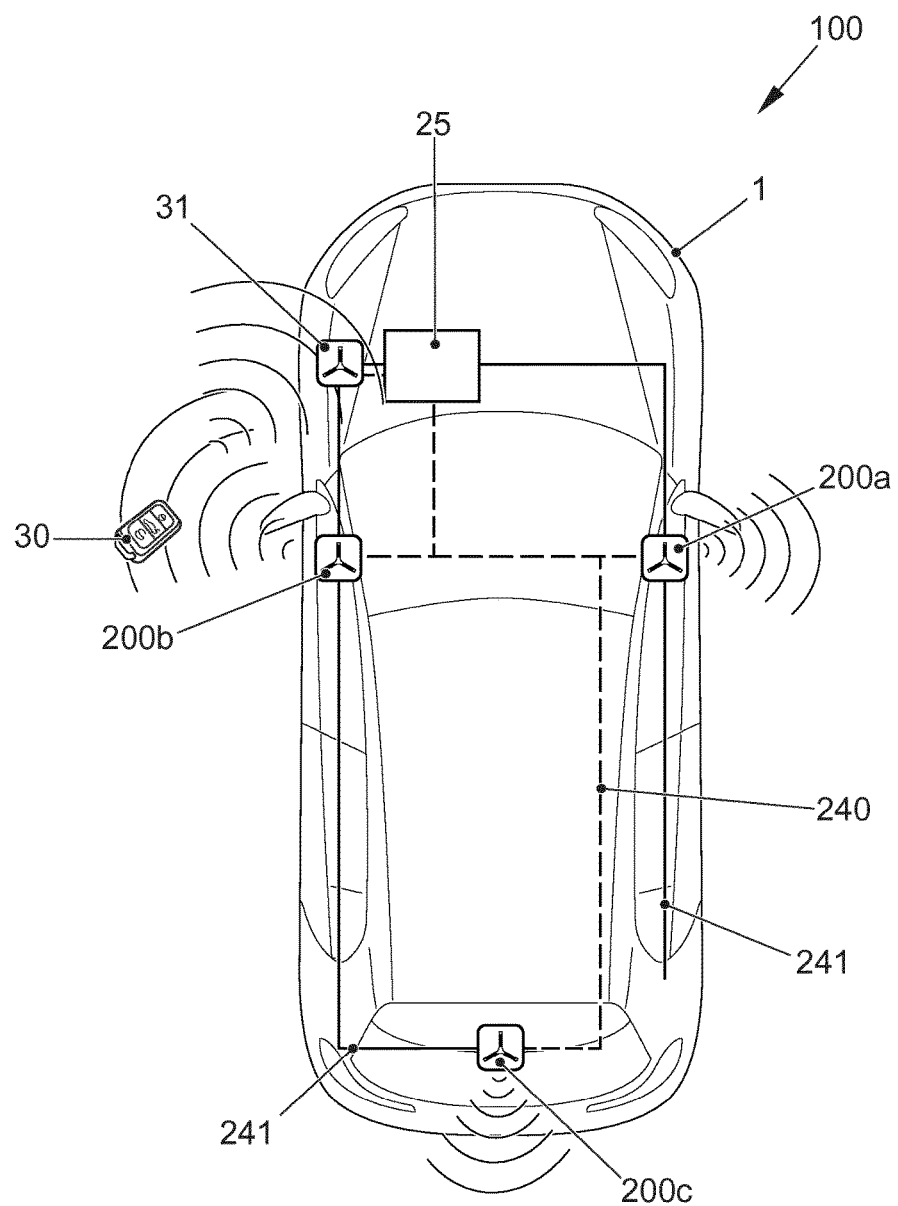
FIG. 14 depicts a structural arrangement of the locating system from FIG. 13 in the motor vehicle; and, FIG. 15 is a flow chart for a method for determining a position of a receiver.

FIG. 14 depicts the locating system 100 with an arrangement in the motor vehicle 1. It may again be seen from FIG. 14 that a control and an energy supply are provided via the separate lines 240, 241. In FIG. 14 the coil arrangements 200a, 200b are installed in the right-hand and left-hand front doors. It would also be possible to install the coil arrangements 200a, 200b in the left-hand and right-hand B columns and/or C columns. Modular additional coil arrangements could be provided, for instance in the rear area of the motor vehicle.

Figure 15:
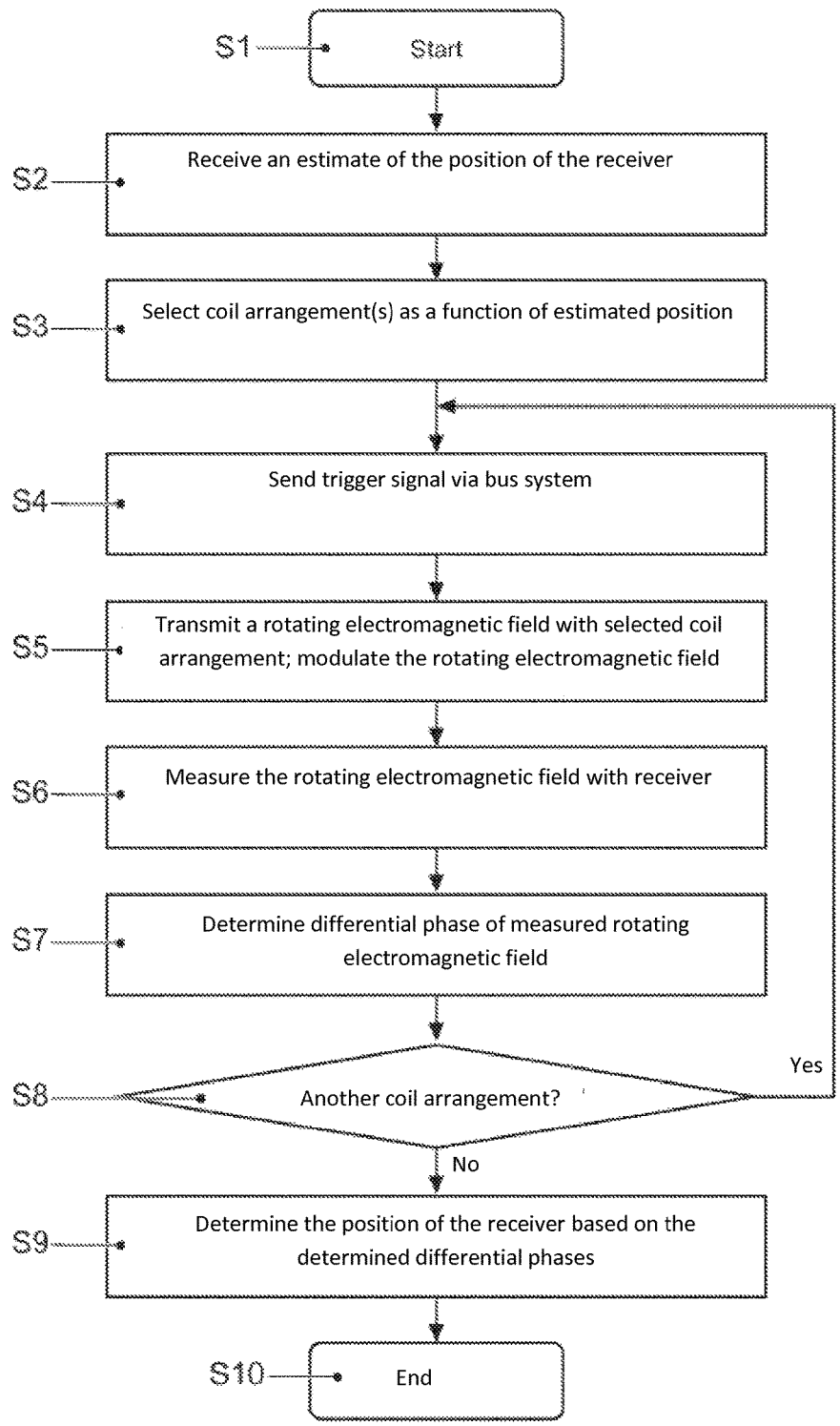

FIG. 15 provides a flow chart for a method for determining a position of a receiver. The method begins with step S1. For instance, the beginning of the method may be triggered by an external trigger signal—such a trigger signal may be e.g. the actuation of a door handle or may be a proximity detection. Then in step S2 an estimate of the position of the receiver 30 is received. For instance the position of the receiver 30 may be estimated via the optical and/or capacitive sensors 20, 21 that are provided in the door handles of the motor vehicle 1 (see also FIG. 13). The estimate of the position of the receiver 30 may therefore for instance include an information level such as, "Receiver 30 is disposed to the left and front of the motor vehicle 1" or "Receiver 30 is disposed behind the motor vehicle 1."

Then in step S3 the coil arrangement is or the coil arrangements are selected that are subsequently to transmit the rotating em field 80, depending on the estimated position in step S2. For instance, if it is known from step S2 that the receiver 30 is disposed to the left and front of the motor vehicle 1, as depicted in FIG. 14, for instance the coil arrangements 200b and 220c may be selected; this is the case because for triangulation based on differential phases (as described in the foregoing with reference to FIGS. 7A and 7B) the information obtained by the determination of the differential phase by means of the coil arrangement 200a based on the low angular difference to the receiver 30 is low relative to the coil arrangement 200b. It would alternatively also be possible for instance to operate all three coil arrangements 200a-200c or merely the coil arrangement 200b etc. In step S4 a trigger signal is transmitted via the bus system to one of the coil arrangements 200a-200c selected in step S3. This current coil arrangement then transmits the rotating electromagnetic field 80. The rotating electromagnetic field 80 is generated by the corresponding coil arrangement 200a-200c such that by modulation it contains both information for identifying the motor vehicle 1 and also timing information 95. For instance, the timing information may include a reference phase with respect to which the differential phases are determined. It would also be possible to determine the differential phases relative to the external trigger signal from step S1. The rotating electromagnetic field 80 may be transmitted by means of applying a plurality of phase-shifted alternating voltages 85 to the various coils 210a-210c of the specific coil arrangement 200a-200c and overlaying the corresponding em fields.

The electromagnetic field 80 is measured in step S6. Therefore steps S5 and S6 may be executed for instance synchronously. The measuring in step S6 may include for instance time/frequency-resolved inductive measurement of the amplitude 81 of the magnetic field component. The differential phase 92 of the measured electromagnetic field 80 is determined in step S7. For instance, step S7 may be performed on a computer unit within the receiver 30. However, it is also possible to transmit the information of the measured rotating electromagnetic field 80 from step S6 via the wireless interface 31 to the control unit 25 so that the latter may execute this step S7. In step S8 there is a check of whether the transmission and measurement of another electromagnetic field 80 by another coil arrangement 200a-200c is necessary. If this is the case, steps S4-S7 are re-executed. Otherwise, in step S9 the position of the receiver is determined based on the determined differential phases 92. Step S9 may include triangulation, for instance. Step S9 may be executed for instance on a computer unit within the control device 25 or in the receiver 30. The method terminates in step S10.

While in the foregoing a technique is explained in which separate trigger signals are used in step S4 for actuating the various coil arrangements 200a-200c, it would also be possible to perform step S4 only once and to include in the trigger signal that is transmitted only once all of the information about which coil arrangement 200a-200c is to generate the electromagnetic field 80. In such a case the trigger signal could initiate timers in each of the coil arrangements 200a-200c; the timers would be configured such that the various coil arrangements 200a-200c transmit the electromagnetic field 80 at different points in time.

Moreover, in addition to the aforesaid time multiplexing, it would also be possible to execute frequency multiplexing techniques and to transmit at least some the various em fields 80 simultaneously.

In addition, it should be understood that step S9 may indicate a different precision for the determination of position P, P' of the receiver 30. For instance, if only one rotating electromagnetic field 80 is transmitted and measured (steps S5 and S6), it may be possible that only the position P, P' of the receiver is determined as an angle or direction A relative to the corresponding coil arrangement 200a-200c. However, if two or more rotating electromagnetic fields 80 are used, the position P, P' of the receiver may be determined precisely within the plane of rotation 300 of the electromagnetic fields 80. This may in particular include the distance a to a coil arrangement 200a-200c. It would optionally be possible in step S6 to measure the field strength of the rotating electromagnetic field 80, i.e. for instance the amplitude 81 of the magnetic component of the electromagnetic field 80 and in step S9 to find from this a distance a' between the position P' of the receiver 30 and the plane of rotation (see broken line in FIG. 6). In particular to this end e.g. an embodiment of the coil arrangement 200 may be used in which individual or a plurality of coils 210a, 210b, 210c are tilted with respect to the coil plane; such a case is illustrated e.g. in FIG. 2. It is also possible to use a plurality of coil arrangements that are tilted with respect to one another. Such configurations may have the advantage that different field strength values are measured for positions that have the same distances with respect to the plane of rotation but are arranged above or below (i.e. bilaterally symmetrical with respect to the plane of rotation). In this manner it is possible to determine whether the receiver 30 is disposed above or below the plane of rotation.

Although the invention has been illustrated and described in greater detail using the preferred embodiments and referencing the figures, the invention is not limited by the disclosed examples and other variations may be derived by one skilled in the art without departing from the protective scope of the invention. For example, it is possible to use techniques that are described in the foregoing and that are used in position determination for a key of a motor vehicle for person-locating systems. Typical applications would be e.g. locating persons and objects that carry with them a receiver for evaluating the phase information. All of the wireless techniques are possible for the transmitter, e.g. Bluetooth©, wireless LAN (WLAN), radio frequency identification (RFID), and others.

For instance, it would also be possible to employ the locating system 100 for different applications that are based on particularly precise position determination. Thus it would be possible e.g. to enable control of the motor vehicle 1 using motion detection of the key 30 by precisely determining the position of the key 30. Thus a left-right movement of the key 30 could cause e.g. a left-right rotation of the motor vehicle 1. The user could be located outside of the motor vehicle 1 and control it remotely.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A coil arrangement for generating a rotating electromagnetic field, the coil arrangement comprising:
   at least three coils, each coil having at least one associated coil winding;
   a ferromagnetic coil yoke that establishes a magnetic coupling between the at least three coils, and
   at least three capacitors, a first capacitor of the at least three capacitors being connected in series to a first coil of the at least three coils, a second capacitor of the at least three capacitors being connected in series to a second coil of the at least three coils and a third capacitor of the at least three capacitors being connected in series to a third coil of the at least three coils,
   wherein two or more coil windings, each having a number of windings that may be actuated jointly or separately, are arranged per coil of the at least three coils, and
   wherein the coil arrangement further comprises at least three additional capacitors, a first additional capacitor of the at least three additional capacitors being connected in parallel to one of the two or more coil windings of the first coil of the at least three coils, a second additional capacitor of the at least three additional capacitors being connected in parallel to one of the two or more coil windings of the second coil of the at least three coils and a third additional capacitor of the at least three additional capacitors being connected in parallel to one of the two or more coil windings of the third coil of the at least three coils.

2. The coil arrangement in accordance with claim 1, wherein the at least three coils are arranged in a coil plane, and wherein adjacent coils are arranged within the coil plane at angles of approximately 120°.

3. The coil arrangement in accordance with claim 1, wherein a third coil of the at least three coils forms an angle with a coil plane spanned by a first and second coil of the at least three coils.

4. The coil arrangement in accordance with claim 1, wherein the ferromagnetic coil yoke is arranged continuous within the at least three coils, and wherein the coil arrangement furthermore comprises:
   a housing having external electrical contacts and mechanical retention elements.

5. The coil arrangement in accordance with claim 1, wherein the ferromagnetic coil yoke has arms extending radially from a center, and wherein each of the coil windings of the at least three coils has a plurality of windings about one of the arms.

6. The coil arrangement in accordance with claim 1, wherein each of the coil windings is configured as a planar conductor forming windings on a printed circuit board, wherein the printed circuit board has recesses for the ferromagnetic coil yoke, and wherein the ferromagnetic coil yoke is arranged above and below the printed circuit board.

7. The coil arrangement in accordance with claim 4, wherein the mechanical retention elements include cylindrical posts that retain the ferromagnetic coil yoke in position within the housing.

* * * * *